(12) United States Patent
Kim et al.

(10) Patent No.: US 12,490,431 B2
(45) Date of Patent: Dec. 2, 2025

(54) SEMICONDUCTOR MEMORY DEVICE AND METHOD OF MANUFACTURING SEMICONDUCTOR MEMORY DEVICE

(71) Applicant: SK hynix Inc., Icheon-si (KR)

(72) Inventors: Jae Taek Kim, Icheon-si (KR); Hye Yeong Jung, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 488 days.

(21) Appl. No.: 17/576,517

(22) Filed: Jan. 14, 2022

(65) Prior Publication Data

US 2023/0057450 A1 Feb. 23, 2023

(30) Foreign Application Priority Data

Aug. 20, 2021 (KR) .......................... 10-2021-0110424

(51) Int. Cl.
 *H10B 43/27* (2023.01)
 *H10B 41/10* (2023.01)
 *H10B 41/27* (2023.01)
 *H10B 43/10* (2023.01)

(52) U.S. Cl.
 CPC ............. *H10B 43/27* (2023.02); *H10B 41/10* (2023.02); *H10B 41/27* (2023.02); *H10B 43/10* (2023.02)

(58) Field of Classification Search
 CPC ........ H10B 43/10; H10B 43/27; H10B 41/10; H10B 41/27; H10B 43/23; H10B 43/40
 See application file for complete search history.

(56) References Cited

U.S. PATENT DOCUMENTS

| | | | |
|---|---|---|---|
| 2019/0333923 A1* | 10/2019 | Kim | H10B 43/50 |
| 2022/0115294 A1* | 4/2022 | Kim | H01L 24/08 |
| 2022/0285383 A1* | 9/2022 | Kubota | H01L 29/8613 |

FOREIGN PATENT DOCUMENTS

| | | |
|---|---|---|
| KR | 1020190106258 A | 9/2019 |
| KR | 1020190124031 A | 11/2019 |
| KR | 1020200069826 A | 6/2020 |

\* cited by examiner

*Primary Examiner* — Jessica S Manno
*Assistant Examiner* — Andrew Chung
(74) *Attorney, Agent, or Firm* — WILLIAM PARK AND ASSOCIATES LTD.

(57) ABSTRACT

A semiconductor memory device includes a discharge contact passing through a source structure, a gate stack disposed on a partial region of the source structure, a vertical structure passing through the gate stack, and an insulating pattern passing through the source structure between the vertical structure and the discharge contact.

17 Claims, 29 Drawing Sheets

(OLR/CTR)

(V ⟷ V')

SEMICONDUCTOR MEMORY DEVICE AND METHOD OF MANUFACTURING SEMICONDUCTOR MEMORY DEVICE

CROSS-REFERENCE TO RELATED APPLICATION

The present application claims priority under 35 U.S.C. § 119(a) to Korean patent application number 10-2021-0110424, filed on Aug. 20, 2021, in the Korean Intellectual Property Office, the entire disclosure of which is incorporated herein by reference.

BACKGROUND

1. Technical Field

Various embodiments of the present disclosure relate to a semiconductor memory device and a method of manufacturing the semiconductor memory device, and more particularly, to a three-dimensional semiconductor memory device and a method of manufacturing the three-dimensional semiconductor memory device.

2. Related Art

In order to improve an integration degree of a semiconductor memory device, a three-dimensional semiconductor memory device including memory cells arranged in a three dimension has been proposed.

In order to improve the integration degree of the three-dimensional semiconductor memory device, the number of memory cells stacked on a substrate may be increased. As the number of stacked memory cells increases, stability of a manufacturing process may be reduced.

SUMMARY

According to an embodiment of the present disclosure, a semiconductor memory device may include a source structure including a gate overlap region and an extension region extending from the gate overlap region, a discharge contact passing through the source structure within the extension region, a gate stack disposed on the source structure within the gate overlap region, a vertical structure passing through the gate stack and having an end overlapping the extension region, and an insulating pattern disposed between the vertical structure and the discharge contact and passing through the source structure within the extension region.

According to an embodiment of the present disclosure, a semiconductor memory device may include a semiconductor substrate, a source structure on the semiconductor substrate, a vertical structure disposed on the source structure, a plurality of conductive patterns disposed on both sides of the vertical structure and spaced apart from each other and stacked on the source structure, a discharge contact passing through a partial region of the source structure at a distance spaced apart from the vertical structure, an insulating pattern passing through the source structure between the discharge contact and the vertical structure, a channel layer passing through the plurality of conductive patterns and connected to the source structure, and a memory pattern between each of the plurality of conductive patterns and the channel layer.

According to an embodiment of the present disclosure, a method of manufacturing a semiconductor memory device may include forming a lower source layer including a gate overlap region and an extension region, the extension region extending from the gate overlap region, forming a sacrificial layer on the lower source layer, forming a discharge contact passing through the lower source layer within the extension region and the sacrificial layer, forming an insulating pattern passing through the lower source layer and the sacrificial layer between the lower source layer within the gate overlap region and the discharge contact, forming a gate stack including a plurality of interlayer insulating layers and a plurality of conductive patterns alternately stacked on the sacrificial layer, and penetrated by a slit, and replacing a portion of the sacrificial layer overlapped by the gate stack with a doped semiconductor layer through the slit.

DETAILED DESCRIPTION

Specific structural and functional descriptions disclosed herein are merely illustrative for the purpose of describing embodiments according to the concept of the present disclosure. Embodiments according to the concept of the present disclosure can be implemented in various forms, and they should not be construed as being limited to the specific embodiments set forth herein.

It will be understood that, although the terms "first", "second", etc. may be used herein to describe various elements, these elements are not limited by these terms. These terms are used for distinguishing one element from another element and not to suggest a number or order of elements. It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present.

An embodiment of the present disclosure may provide a semiconductor memory device and a method of manufacturing the semiconductor memory device, wherein the device and method are capable of improving stability of a manufacturing process.

Figure 1:
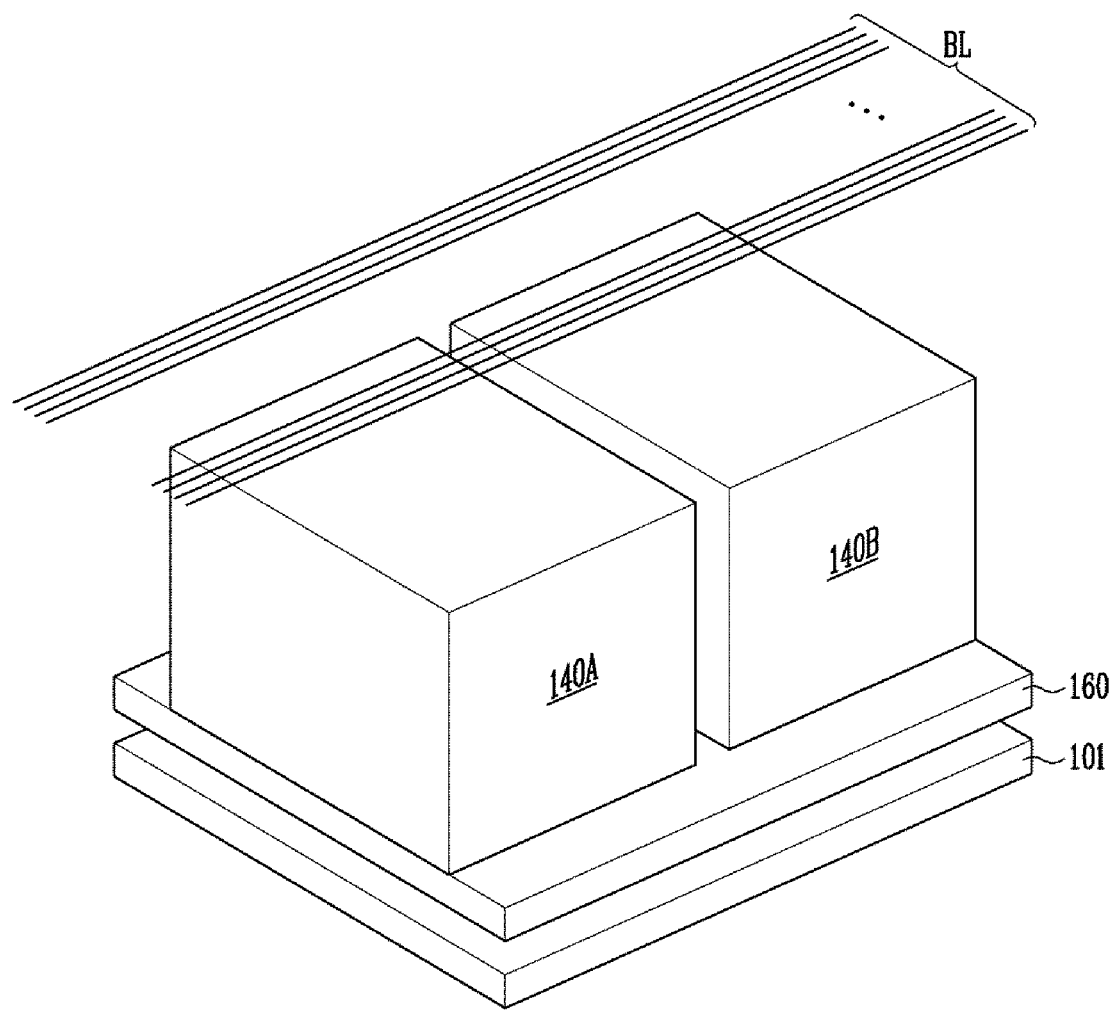
FIG. 1 illustrates a schematic vertical arrangement of a semiconductor memory device according to an embodiment of the present disclosure.

FIG. 1 illustrates a schematic vertical arrangement of a semiconductor memory device according to an embodiment of the present disclosure.

Referring to FIG. 1, the semiconductor memory device may include a semiconductor substrate 101, a source structure 160, a plurality of memory cell arrays 140A and 140B, and a plurality of bit lines BL.

The source structure 160, the plurality of memory cell arrays 140A and 140B, and the plurality of bit lines BL may be arranged on the semiconductor substrate 101. As an embodiment, the source structure 160 may be disposed between the semiconductor substrate 101 and the plurality of memory cell arrays 140A and 140B.

The plurality of memory cell arrays 140A and 140B may include a plurality of memory cell strings connected to the source structure 160 and the plurality of bit lines BL. As an embodiment, the semiconductor memory device may include a first memory cell array 140A and a second memory cell array 140B, and each of the first memory cell array 140A and the second memory cell array 140B may include the plurality of memory cell strings connected to the source structure 160 and the plurality of bit lines BL. Each memory cell string may include a channel layer connected to the bit line BL and the source structure corresponding thereto. As an embodiment, the channel layer may be disposed between the source structure 160 and the bit line BL corresponding thereto.

Although omitted in FIG. 1 for convenience of description, a lower insulating structure and a plurality of interconnections passing through the lower insulating structure may be disposed between the semiconductor substrate 101 and the source structure 160. In addition, a portion of the source structure 160 may be penetrated by an insulating pattern and a first insulating pillar.

Although omitted in FIG. 1 for convenience of description, the memory cell string of each of the first memory cell array 140A and the second memory cell array 140B may be connected to a plurality of conductive patterns spaced apart from each other and stacked on the source structure 160.

Hereinafter, the first memory cell array 140A and the second memory cell array 140B are described with reference to FIG. 2.

Figure 2:
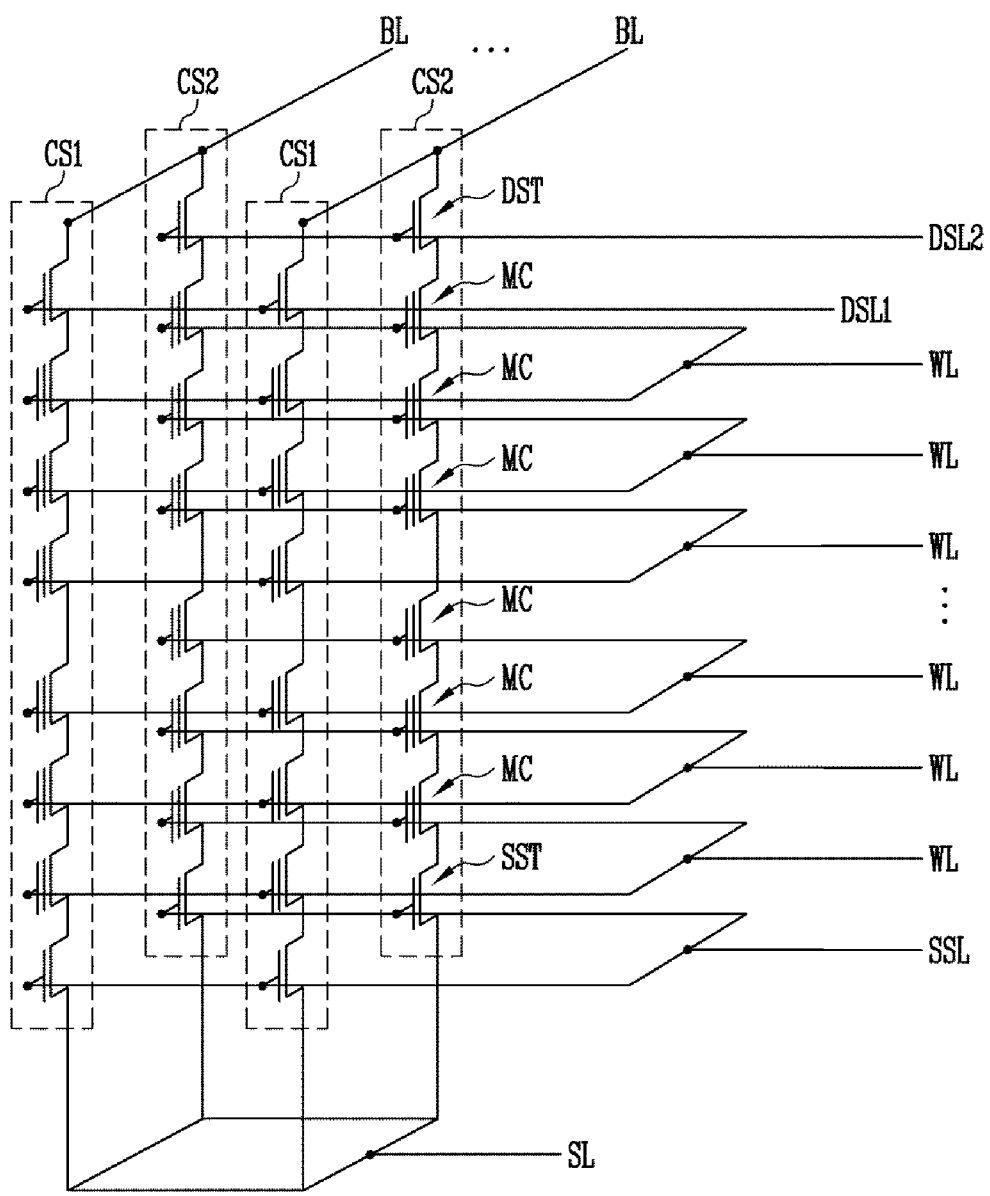
FIG. 2 is a circuit diagram illustrating a memory cell array according to an embodiment of the present disclosure.

FIG. 2 is a circuit diagram illustrating a memory cell array according to an embodiment of the present disclosure.

Referring to FIG. 2, each of the first memory cell array 140A and the second memory cell array 140B shown in FIG. 1 may include a plurality of memory cell strings CS1 and CS2. The plurality of memory cell strings CS1 and CS2 may be commonly connected to a source line SL. As an embodiment, a plurality of first memory cell strings CS1 and a plurality of second memory cell strings CS2 may be commonly connected to the source line SL. A pair of first memory cell strings CS1 and second memory cell strings CS2 may be connected to each bit line BL. The source line SL may be connected to the source structure 160 shown in FIG. 1, and the source line SL may be connected to the plurality of memory cell strings CS1 and CS2 through the source structure 160 shown in FIG. 1.

Each of the first memory cell strings CS1 and each of the second memory cell strings CS2 may include a source select transistor SST, a plurality of memory cells MC, and a drain select transistor DST connected in series.

The source select transistor SST may control an electrical connection between the plurality of memory cells MC and the source line SL. One source select transistor SST may be disposed between the source line SL and the plurality of memory cells MC. Although not shown in the drawing, two or more source select transistors connected in series between the source line SL and the plurality of memory cells MC may be disposed. A gate of the source select transistor SST may be connected to the source select line SSL. An operation of the source select transistor SST may be controlled by a source gate signal applied to the source select line SSL.

The plurality of memory cells MC may be disposed between the source select transistor SST and the drain select transistor DST. The plurality of memory cells MC may be connected in series. Gates of the plurality of memory cells MC may be connected to the plurality of word lines WL, respectively. An operation of each memory cell MC may be controlled by cell gate signals applied to a corresponding word line WL.

The drain select transistor DST may control an electrical connection between the plurality of memory cells MC and the bit line BL. A gate of the drain select transistor DST may be connected to a drain select line DSL1 or DSL2. An operation of the drain select transistor DST may be controlled by a drain gate signal applied to the drain select line DSL1 or DSL2.

The plurality of first memory cell strings CS1 may be connected to the first drain select line DSL1. The plurality of second memory cell strings CS2 may be connected to the second drain select line DSL2. Accordingly, one memory cell string among the plurality of first memory cell strings CS1 and the plurality of second memory cell strings CS2 may be selected, by selecting one bit line among the plurality of bit lines BL and selecting one drain select line among the first drain select line DSL1 and the second drain select line DSL2.

The plurality of first memory cell strings CS1 and the plurality of second memory cell strings CS2 may be commonly connected to each word line WL.

The plurality of first memory cell strings CS1 and the plurality of second memory cell strings CS2 may be commonly connected to the source select line SSL. An embodiment of the present disclosure is not limited thereto. Although not shown in the drawing, as an embodiment, the memory cell array may include a first source select line and a second source select line separated from each other. The first source select line may be connected to the plurality of first memory cell strings, and the second source select line may be connected to the plurality of second memory cell strings.

A configuration of each of the first memory cell array 140A and the second memory cell array 140B is not limited to that shown in FIG. 2, and may be variously changed.

Figure 3:
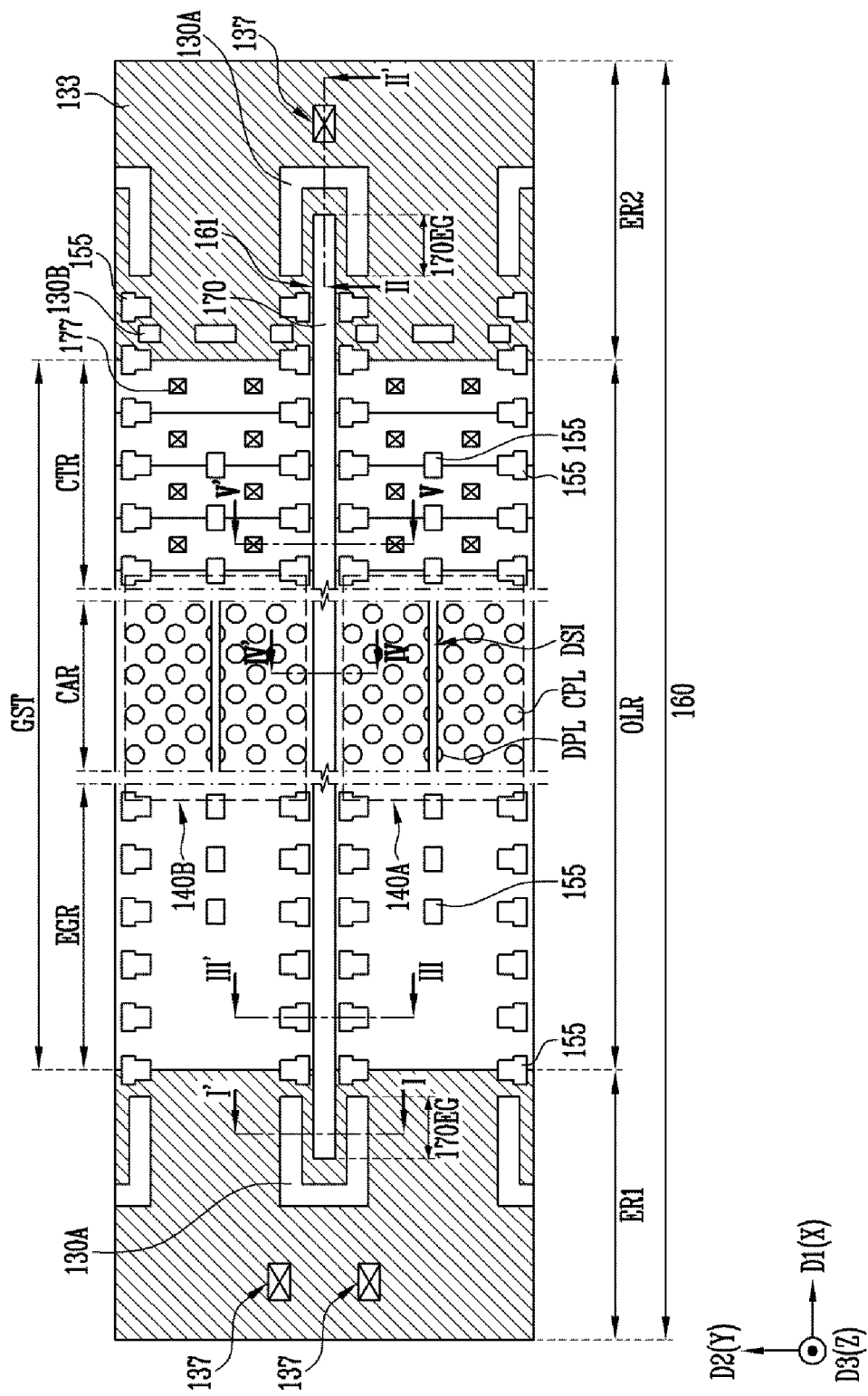
FIG. 3 is a plan view illustrating a partial configuration of a semiconductor memory device according to an embodiment of the present disclosure.

FIG. 3 is a plan view illustrating a partial configuration of a semiconductor memory device according to an embodiment of the present disclosure.

Referring to FIG. 3, the semiconductor memory device may include the source structure 160, a discharge contact 137 passing through the source structure 160, and the first memory cell array 140A and the second memory cell array 140B disposed on the source structure 160. The first memory cell array 140A and the second memory cell array 140B may include a gate stack GST on the source structure 160 and a plurality of cell plugs CPL passing through the gate stack GST. The first memory cell array 140A and the second memory cell array 140B may be disposed on both sides of the slit 161 passing through the gate stack GST.

Figure 5A:
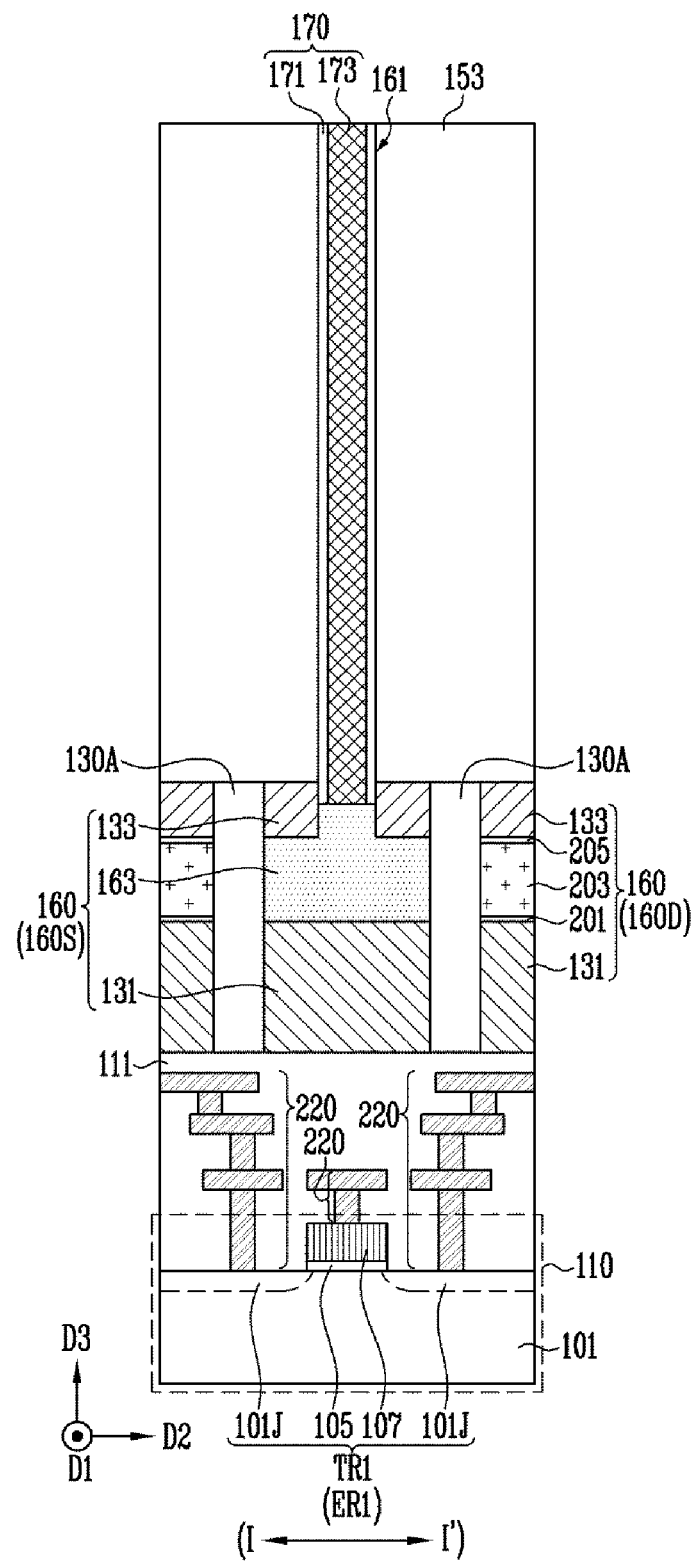
FIGS. 5A, 5B, 5C, and 5D are cross-sectional views of the semiconductor memory device shown in FIG. 3.
Figure 5B:
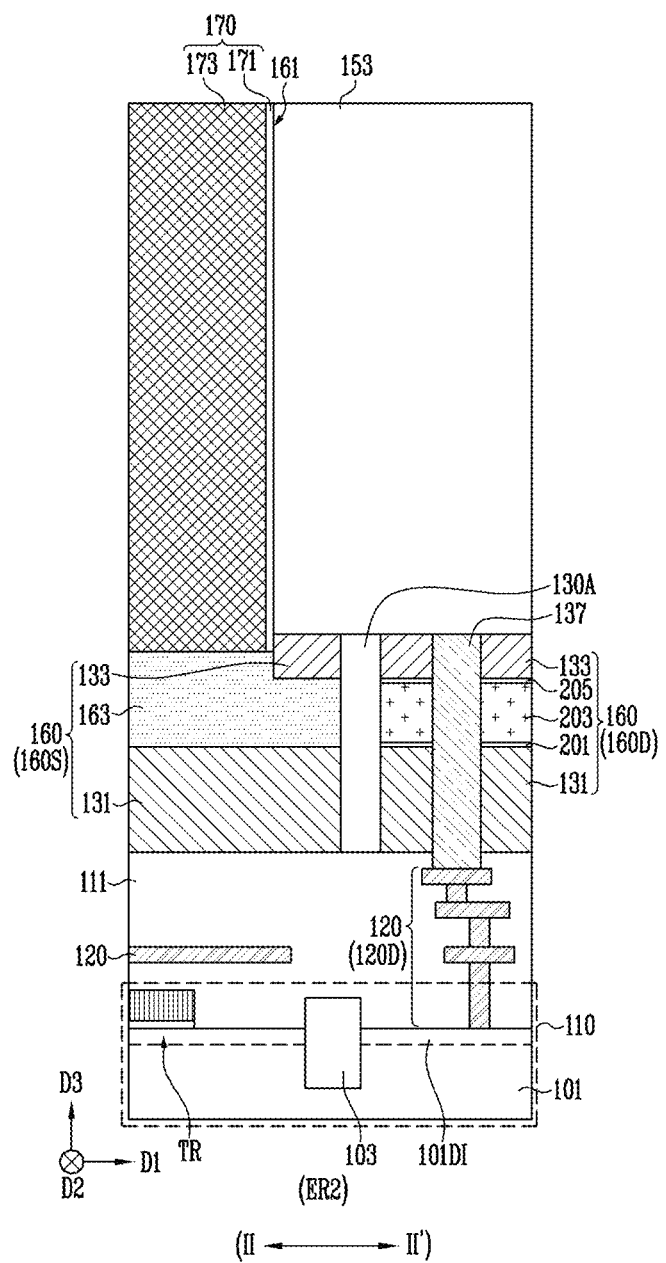

The source structure 160 may include the gate overlap region OLR and at least one extension region extending from the gate overlap region OLR. As an embodiment, the source structure 160 may include the gate overlap region OLR and a first extension region ER1 and a second extension region ER2 extending in different directions from the gate overlap region OLR. For example, the second extension region ER2 may be a region spaced apart from the first extension region ER1 in a first direction D1. The first direction D1 may be defined as an extension direction of the slit 161 in a plan view. As an embodiment, the first extension region ER1 may extend from the gate overlap region OLR in a direction opposite to the first direction D1, and the second extension region ER2 may extend from the gate overlap region OLR in the first direction D1. As shown in FIGS. 5A and 5B, the first extension region ER1 and the second extension region ER2 of the source structure 160 may be covered with an upper insulating layer 153. For convenience of recognition of the first extension region ER1 and the second extension region ER2 of the source structure 160, the upper insulating layer 153 is omitted in FIG. 3.

The source structure 160 may extend in the first direction D1 and a second direction D2. The second direction D2 may be defined as a direction crossing the extension direction of the slit 161 in a plan view. As shown in FIGS. 5A to 5D, the source structure 160 may include a lower source layer 131, a doped semiconductor layer 163, and an upper source layer 133 stacked in a third direction D3, and may further include a sacrificial layer 203 disposed at a level at which the doped semiconductor layer 163 is disposed. The third direction D3 may be defined as a direction crossing an upper surface of the source structure 160. As an embodiment, the first direction D1, the second direction D2, and the third direction D3 may correspond to an X-axis direction, a Y-axis direction, and a Z-axis direction of an XYZ coordinate system, respectively.

Figure 4:
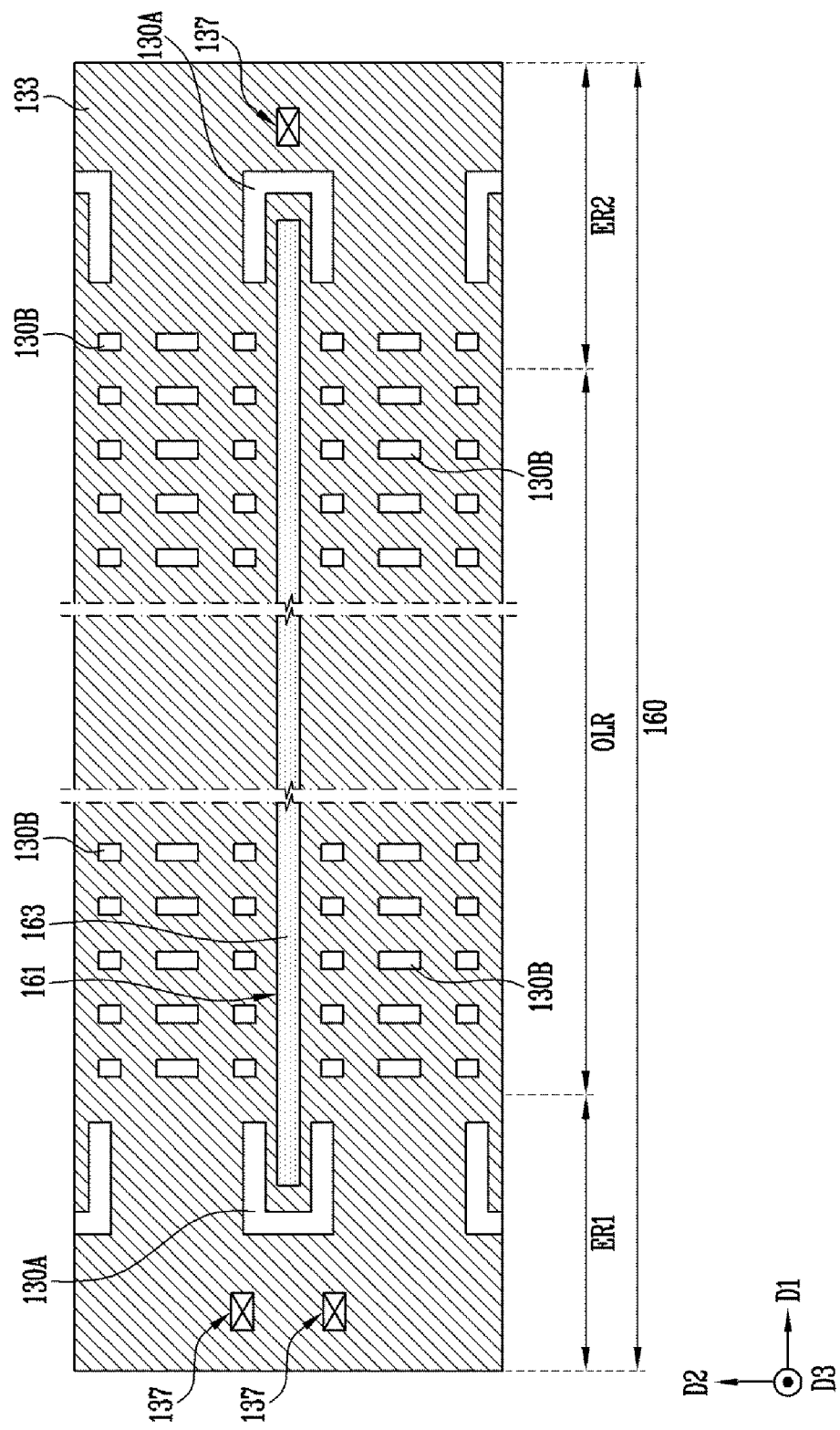
FIG. 4 is a plan view illustrating an upper source layer of a source structure shown in FIG. 3.

FIG. 4 is a plan view illustrating the upper source layer 133 of the source structure 160 shown in FIG. 3.

Referring to FIGS. 3 and 4, the slit 161 may extend to pass through the upper source layer 133 of the source structure 160. As an embodiment, a portion of the slit 161 passing through the upper source layer 133 may be filled with the doped semiconductor layer 163 and a remaining portion may be filled with a vertical structure 170. The present disclosure is not limited thereto. For example, the slit 161 may be completely filled with the vertical structure 170. The vertical structure 170 may include an insulating material, or may include a spacer insulating layer 171 and a conductive source contact 173 as shown in FIGS. 5A to 5D. The vertical structure 170 may include an end 170EG overlapping each of the first extension region ER1 and the second extension region ER2 of the source structure 160.

The discharge contact 137 may be disposed at a position spaced apart from the end 170EG and the slit 161 of the vertical structure 170, and may pass through at least one of the first extension region ER1 and the second extension region ER2 of the source structure 160. The source structure 160 may be penetrated not only by the discharge contact 137, but also by an insulating pattern 130A and a plurality of first insulating pillars 130B.

The insulating pattern 130A may pass through at least one of the first extension region ER1 and the second extension region ER2 of the source structure 160. In order to manufacture the semiconductor memory device, an etching process for opening a horizontal space in which the doped semiconductor layer 163 is disposed may be performed through the slit 161. In an embodiment, the insulating pattern 130A may be disposed between the vertical structure 170 and the discharge contact 137 to prevent or mitigate the discharge contact 137 from being oxidized during the etching process for opening the horizontal space. The insulating pattern 130A may extend to surround an end of the slit 161 at a distance spaced apart from the slit 161. In other words, the insulating pattern 130A may be formed to extend to surround the end 170EG of the vertical structure 170. As an embodiment, the insulating pattern 130A may have a U-shaped cross-section to surround the end 170EG of the vertical structure 170.

The plurality of first insulating pillars 130B may pass through the gate overlap region OLR of the source structure 160 at both sides of the vertical structure 170.

The source structure 160 may extend to surround the first insulating pillar 130B, the discharge contact 137, and the insulating pattern 130A.

Referring to FIG. 3, the gate stack GST may be disposed on the gate overlap region OLR of the source structure 160. The gate stack GST may include a memory cell array region CAR, a contact region CTR, and an edge region EGR. The contact region CTR and the edge region EGR may be defined as regions extending in different directions from the memory cell array region CAR.

The edge region EGR of the gate stack GST may be defined as a region adjacent to a chip edge. The contact region CTR of the gate stack GST may be defined as a region overlapping a plurality of gate contacts 177. The contact region CTR of the gate stack GST and the edge region EGR of the gate stack GST may be formed in different structures. As an embodiment, the contact region CTR of the gate stack GST may be formed in a stepped structure, and the edge region EGR of the gate stack GST may be etched in a substantially straight shape so as not to have a stepped structure. An embodiment of the present disclosure is not limited thereto, and the structures of the contact region CTR and the edge region EGR may be variously designed.

The contact region CTR and the edge region EGR of the gate stack GST may be penetrated by a plurality of second insulating pillars 155.

The first extension region ER1 of the source structure 160 may be defined as a region adjacent to the edge region EGR of the gate stack GST, and the second extension region ER2 of the source structure 160 may be defined as a region adjacent to the contact region CTR of the gate stack GST. The discharge contact 137 and the insulating pattern 130A may be adjacent to at least one of the edge region EGR and the contact region CTR of the gate stack GST. For example, the discharge contact 137 and the insulating pattern 130A may be disposed in the first extension region ER1 of the source structure 160 adjacent to the edge region EGR of the gate stack GST, or may be disposed in the second extension region ER2 of the source structure 160 adjacent to the contact region CTR of the gate stack GST. Alternatively, the discharge contact 137 and the insulating pattern 130A may be disposed in each of the first extension region ER1 and the second extension region ER2 of the source structure 160.

Figure 5C:
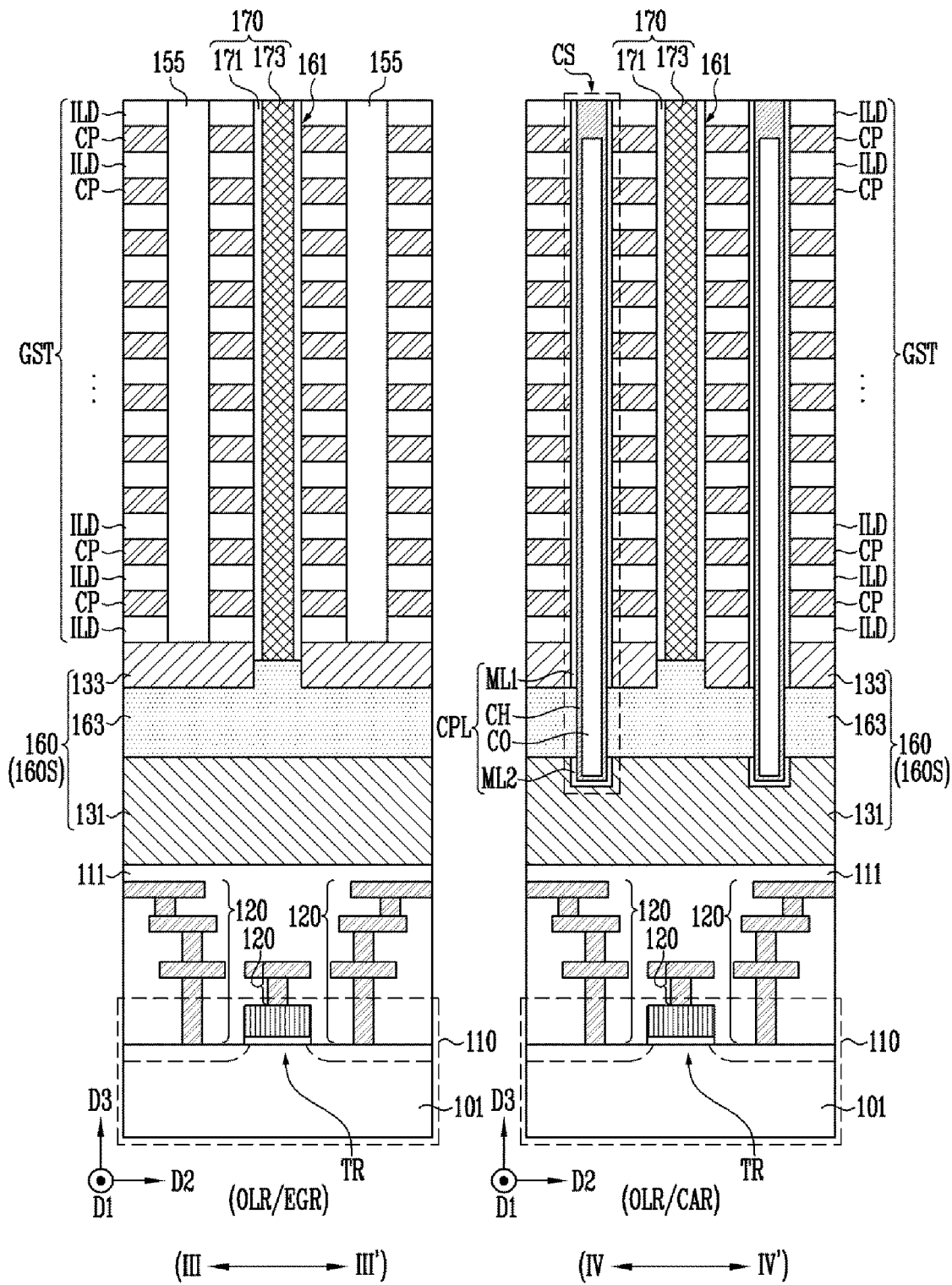
Figure 5D:
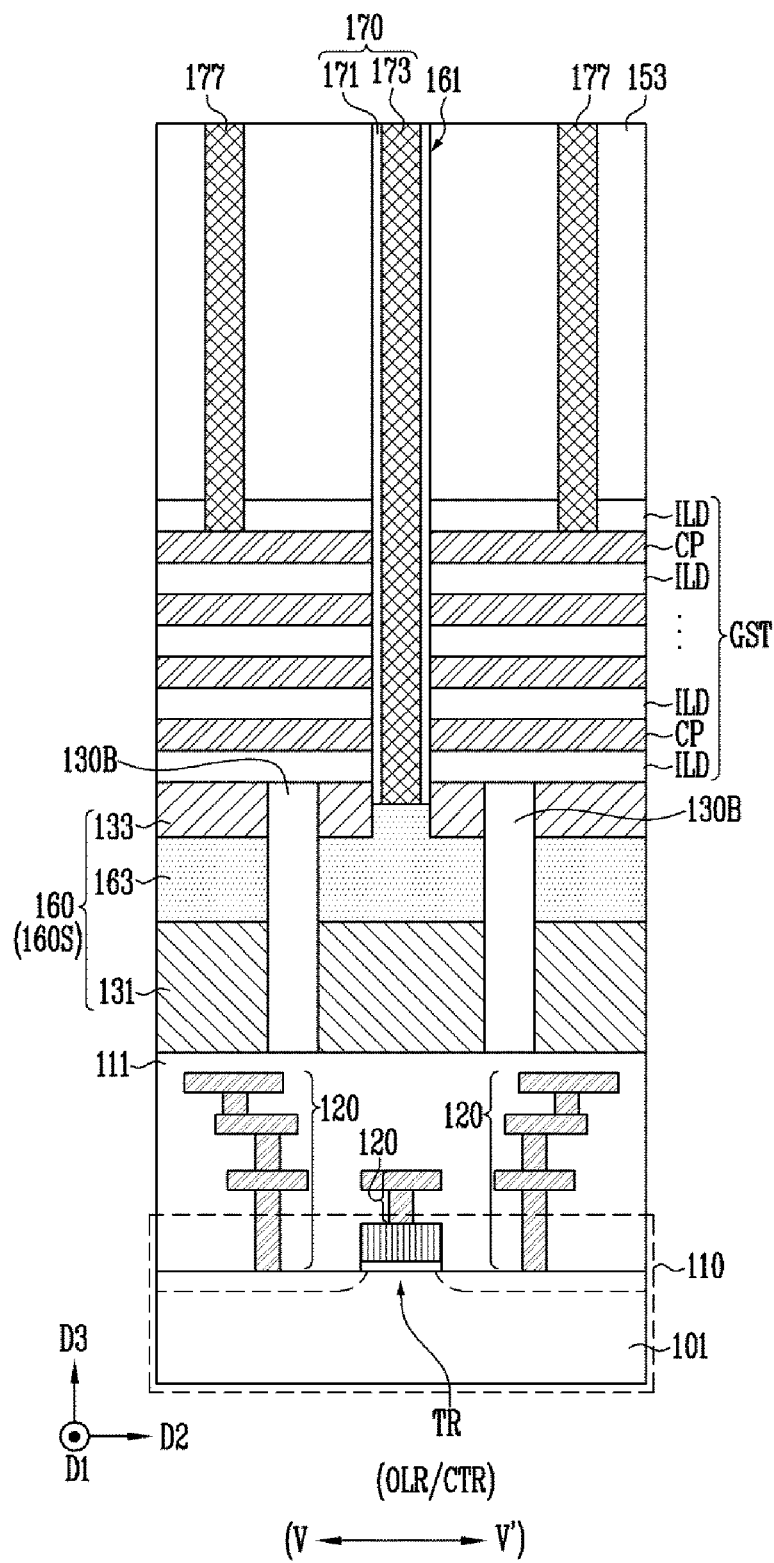

The gate stack GST may include a plurality of conductive patterns of the first memory cell array 140A and a plurality of conductive patterns of the second memory cell array 140B. The plurality of conductive patterns of the first memory cell array 140A and the plurality of conductive patterns of the second memory cell array 140B may be disposed on both sides of the vertical structure 170, and may be spaced apart from each other in the second direction D2. The plurality of conductive patterns CP of each of the first memory cell array 140A and the second memory cell array 140B are shown in FIGS. 5C and 5D. As shown in FIGS. 5C and 5D, the plurality of conductive patterns CP may be stacked while being spaced apart from each other in the third direction D3. In addition, among the plurality of conductive patterns CP, conductive patterns disposed on a layer farthest from the source structure 160 in the third direction D3 may be separated from each other by not only the slit 161 but also a drain separation slit DSI as shown in FIG. 3. The drain separation slit DSI may pass through an upper end of the gate stack GST at a length shorter than that of the slit 161.

Each of the first memory cell array 140A and the second memory cell array 140B may include a plurality of cell plugs CPL extending in the third direction D3 to pass through the memory cell array region CAR of the gate stack GST. The memory cell array region CAR of the gate stack GST may be penetrated by a plurality of dummy plugs DPL. The plurality of dummy plugs DPL may include the same material layers as the plurality of cell plugs CPL, and may be arranged in a line along the drain separation slit DSI. The dummy plug DPL may be omitted, and a shape of the drain separation slit DSI is not limited to a straight shape shown in FIG. 3, and may be variously designs such as a wave shape.

FIGS. 5A, 5B, 5C, and 5D are cross-sectional views of the semiconductor memory device shown in FIG. 3. FIG. 5A is a cross-sectional view of the first extension region ER1 of the source structure 160 taken along a line I-I' shown in FIG. 3. FIG. 5B is a cross-sectional view of the second extension region ER2 of the source structure 160 taken along a line II-II' shown in FIG. 3. FIG. 5C is a cross-sectional view of the gate overlap region OLR of the source structure 160 overlapped by the edge region EGR of the gate stack GST taken along the line III-III' shown in FIG. 3 and a cross-sectional view of the gate overlap region OLR of the source structure 160 overlapped by the memory cell array region CAR of the gate stack GST taken along a line IV-IV' shown in FIG. 3. FIG. 5D is a cross-sectional view of the gate overlap region OLR of the source structure 160 overlapped by the contact region CTR of the gate stack GST taken along a line V-V' shown in FIG. 3.

Referring to FIGS. 5A to 5D, the source structure 160 may be disposed on the semiconductor substrate 101.

The semiconductor substrate 101 may include a plurality of active regions partitioned by an element isolation layer 103. Impurity regions may be formed in the active regions. Each impurity region may be defined as a region into which at least one of n-type and p-type conductive impurities is implanted. The impurity regions may include a discharge impurity region 101DI and a plurality of junctions 101J of a plurality of transistors TR.

The plurality of transistors TR may configure a peripheral circuit structure 110 for controlling the first memory cell array 140A and the second memory cell array 140B shown in FIG. 3. As an embodiment, the plurality of transistors TR may be configured to control at least one of the word line WL of FIG. 2, the drain select lines DSL1 and DSL2 of FIG. 2, the source select line SSL of FIG. 2, the source line SL of FIG. 2, and the bit line BL of FIG. 2 connected to each of the first memory cell array 140A and the second memory cell array 140B. Each transistor TR may include a gate insulating layer 105 on the semiconductor substrate 101, a gate electrode 107 on the gate insulating layer 105, and junction regions 101J on both sides of the gate electrode 107.

The discharge impurity region 101DI may include an impurity of a conductivity type different from that of the doped semiconductor layer 163 of the source structure 160. As an embodiment, the doped semiconductor layer 163 may include an n-type impurity, and the discharge impurity region 101DI may include a p-type impurity.

The peripheral circuit structure 110 and the semiconductor substrate 101 may be covered with a lower insulating structure 111. The lower insulating structure 111 may include two or more insulating layers. The discharge impurity region 101DI and the plurality of transistors TR may be connected to each of the plurality of interconnections 120. Each interconnection 120 may be defined by a connection structure between a plurality of conductive patterns buried in the lower insulating structure 111. Hereinafter, the interconnection 120 connected to the discharge impurity region 101DI among the plurality of interconnections 120 is referred to as a discharge interconnection 120D. The discharge impurity region 101DI may be connected to the discharge contact 137 via the discharge interconnection 120D.

The source structure 160 may be disposed on the lower insulating structure 111. The source structure 160 may be connected to the discharge impurity region 101DI via the discharge contact 137.

The source structure 160 may include the lower source layer 131, the doped semiconductor layer 163, the sacrificial layer 203, and the upper source layer 133. The doped semiconductor layer 163 may include an n-type impurity. As an embodiment, the doped semiconductor layer 163 may include n-type doped silicon. Each of the lower source layer 131 and the upper source layer 133 may be formed of various conductive materials. As an embodiment, each of the lower source layer 131 and the upper source layer 133 may include a doped semiconductor layer such as n-type doped silicon. The sacrificial layer 203 may include an undoped semiconductor layer. As an embodiment, the sacrificial layer 203 may include undoped silicon.

The lower source layer 131 may extend from the gate overlap region OLR to the first extension region ER1 and the second extension region ER2. The lower source layer 131 may be formed in a planar pattern extending to face an upper surface of the semiconductor substrate 101.

The sacrificial layer 203 may be disposed at a level at which the doped semiconductor layer 163 is disposed. In other words, the doped semiconductor layer 163 and the sacrificial layer 203 may be disposed in different regions on the lower source layer 131. A disposition region of the doped semiconductor layer 163 and the sacrificial layer 203 may be controlled according to a distance from the slit 161 and a position of the insulating pattern 130A surrounding the slit 161.

The doped semiconductor layer 163 may be disposed in the gate overlap region OLR to surround the plurality of cell plugs CPL. In a plan view, the doped semiconductor layer 163 may extend from a region in which the slit 161 is disposed in a direction away from the slit 161. A bottom surface of the doped semiconductor layer 163 may be in contact with the lower source layer 131.

The sacrificial layer 203 may be spaced apart from the doped semiconductor layer 163 by the insulating pattern 130A. The sacrificial layer 203 may be disposed in the first extension region ER1 and the second extension region ER2 to surround the discharge contact 137. In a plan view, the sacrificial layer 203 may extend in a direction opposite to a direction from a sidewall of the insulating pattern 130A toward the slit 161.

The upper source layer 133 may be disposed on the doped semiconductor layer 163 and may extend to overlap the sacrificial layer 203. That is, the upper source layer 133 may extend from the gate overlap region OLR to the first extension region ER1 and the second extension region ER2.

The source structure 160 may further include a first protective layer 201 and a second protective layer 205. The first protective layer 201 may be disposed between the lower source layer 131 and the sacrificial layer 203, and the second protective layer 205 may be disposed between the sacrificial layer 203 and the upper source layer 133. That is, the first protective layer 201, the sacrificial layer 203, and the second protective layer 205 may be stacked on the lower source layer 131. The first protective layer 201, the sacrificial layer 203, and the second protective layer 205 may be disposed at a level at which the doped semiconductor layer 163 is disposed. Each of the first protective layer 201, the sacrificial layer 203, and the second protective layer 205 may be disposed in the first extension region ER1 and the second extension region ER2 to surround the discharge contact 137. Each of the first protective layer 201, the sacrificial layer 203, and the second protective layer 205 may be overlapped by the upper source layer 133.

The source structure 160 may be divided into a source pattern 160S and a dummy pattern 160D formed in different stack structures. The source pattern 160S may include the doped semiconductor layer 163, a partial region of the lower source layer 131 overlapped by the doped semiconductor layer 163, and a partial region of the upper source layer 133 overlapped to the doped semiconductor layer 163. The dummy pattern 160D may include the sacrificial layer 203, a partial region of the lower source layer 131 overlapped by the sacrificial layer 203, and a partial region of the upper source layer 133 overlapped to the sacrificial layer 203. The dummy pattern 160D may further include the first protective layer 201 and the second protective layer 205.

The dummy pattern 160D may extend from the source pattern 160S. For example, as shown in FIG. 4, the upper source layer 133 may include a region disposed in the gate overlap region OLR and forming the source pattern 160S, and regions disposed in the first extension region ER1 and the second extension region ER2 extending from the gate overlap region OLR and forming the dummy pattern 160D.

The insulating pattern 130A may pass through the source structure 160 between the vertical structure 170 and the discharge contact 137. One side of the insulating pattern 130A may be in contact with the dummy pattern 160D, and another side may be in contact with the source pattern 160S. According to such disposition, the insulating pattern 130A may be considered to be disposed between the doped semiconductor layer 163 and the sacrificial layer 203.

The discharge contact 137 may pass through the dummy pattern 160D at a position spaced apart from the doped semiconductor layer 163. A sidewall of the discharge contact 137 may be in contact with the dummy pattern 160D surrounding this. That is, the sidewall of the discharge contact 137 may be in contact with the first protective layer 201, the sacrificial layer 203, and the second protective layer 205.

The upper source layer 133 of the source structure 160 may be penetrated by a portion of the slit 161. A portion of the slit 161 passing through the upper source layer 133 may be filled with at least one of the doped semiconductor layer 163 and the vertical structure 170.

The vertical structure 170 may overlap the source structure 160. The vertical structure 170 may include a spacer insulating layer 171 and a conductive source contact 173. The spacer insulating layer 171 may extend along a sidewall of the slit 161. The conductive source contact 173 may be insulated from the plurality of conductive patterns CP of the gate stack GST by the spacer insulating layer 171. The conductive source contact 173 may be connected to the source pattern 160S of the source structure 160. As an embodiment, the conductive source contact 173 may be in contact with the doped semiconductor layer 163. A configuration of the vertical structure 170 is not limited to that described above, and may be variously changed. For example, the vertical structure 170 may be configured of an insulating material that completely fills the slit 161.

The gate stack GST may overlap the gate overlap region OLR of the source structure 160, and might not overlap the first extension region ER1 and the second extension region ER2 of the source structure 160. The gate stack GST may include a plurality of conductive patterns CP disposed on both sides of the vertical structure 170.

The plurality of conductive patterns CP may be disposed to be spaced apart from each other in the second direction D2 and the third direction D3 on the source pattern 160S of the source structure 160. The plurality of conductive patterns CP may be used as the first drain select line DSL1, the second drain select line DSL2, the plurality of word lines WL, and the source select line SSL shown in FIG. 2. As an embodiment, at least one layer adjacent to the source structure 160 among the plurality of conductive patterns CP may be used as the source select line SSL shown in FIG. 2. Among the plurality of conductive patterns CP, conductive patterns disposed on at least one layer disposed farthest from the source structure 160 may be used as the first drain select line DSL1 and the second drain select line DSL2 shown in FIG. 2. Among the plurality of conductive patterns CP, conductive patterns disposed between each of the first drain select line DSL1 and the second drain select line DSL2 and the source select line SSL may be used as the word lines WL shown in FIG. 2.

The plurality of conductive patterns CP may be alternately disposed with a plurality of interlayer insulating layers ILD in the third direction D3. The plurality of conductive patterns CP and the plurality of interlayer insulating layers ILD alternately disposed in the third direction D3 may form the gate stack GST. The plurality of conductive patterns CP and the plurality of interlayer insulating layers ILD may form a stepped structure in the contact region CTR of the gate stack GST as shown in FIG. 3. The first extension region ER1 and the second extension region ER2 of the source structure 160, which do not overlap the gate stack GST, may be covered with the upper insulating layer 153.

The upper insulating layer 153 may cover the contact region CTR of the gate stack GST. A portion of the upper insulating layer 153 may be penetrated by the end 170EG shown in FIG. 3 of the vertical structure 170 protruding onto the first extension region ER1 and the second extension region ER2 of the source structure 160. The spacer insulating layer 171 of the vertical structure 170 may extend from a region between the gate stack GST and the conductive source contact 173 to a region between the upper insulating layer 153 and the conductive source contact 173.

Partial regions of the source structure 160 overlapping the edge region EGR and the contact region CTR of the gate stack GST may be penetrated by the plurality of first insulating pillars 130B. The edge region EGR and the contact region CTR of the gate stack GST may be penetrated by the plurality of second insulating pillars 155.

The second insulating pillars 155 passing through each of the edge region EGR and the contact region CTR of the gate stack GST may be disposed on both sides of the vertical structure 170. The gate contact 177 overlapping the contact region CTR of the gate stack GST may pass through the upper insulating layer 153 and the interlayer insulating layer ILD to be in contact with the conductive pattern CP corresponding thereto.

The memory cell array region CAR of the gate stack GST may be penetrated by the plurality of cell plugs CPL. The plurality of memory cell strings CS may be defined by the plurality of conductive patterns CP and the plurality of cell plugs CPL. Each cell plug CPL may include a channel layer CH, a core insulating layer CO, a first memory pattern ML1, and a second memory pattern ML2.

The channel layer CH may extend in the third direction D3 to pass through the plurality of interlayer insulating layers ILD and the plurality of conductive patterns CP. The channel layer CH may extend into the source structure 160 to be in contact with the source structure 160. As an embodiment, the channel layer CH may pass through the upper source layer 133 of the source structure 160 and may extend into the lower source layer 131. The doped semiconductor layer 163 of the source structure 160 may be in contact with a sidewall of the channel layer CH and may surround the sidewall of the channel layer CH. The channel layer CH may be used as a channel region of the memory cell string CS. The channel layer CH may be comprised of a semiconductor layer. The channel layer CH may extend along a sidewall, a bottom surface, and an upper surface of the core insulating layer CO. A doped region may be defined at an end of the channel layer CH formed on the core insulating layer CO. The doped region of the channel layer CH may include an n-type impurity.

The first memory pattern ML1 may be disposed between each of the conductive patterns CP and the channel layer CH. As an embodiment, the first memory pattern ML1 may be disposed between the gate stack GST and the channel layer CH, and may be extend between the upper source layer 133 and the channel layer CH of the source structure 160. The second memory pattern ML2 may be disposed between the lower source layer 131 and the channel layer CH of the source structure 160. Although not specifically shown in the drawing, each of the first memory pattern ML1 and the second memory pattern ML2 may include a first blocking insulating layer extending along a surface of the channel layer CH, a data storage layer between the first blocking layer and the channel layer CH, and a tunnel insulating layer between the data storage layer and the channel layer CH. The tunnel insulating layer may include an insulating material capable of charge tunneling. As an embodiment, the tunnel insulating layer may include a silicon oxide layer. The data storage layer may include an insulating material capable of trapping charges. As an embodiment, the data storage layer may include a nitride layer. The first blocking insulating layer may include a silicon oxide layer. Although not shown in the drawing, a second blocking insulating layer may be additionally disposed between the first blocking insulating layer and each conductive pattern CP. The second blocking insulating layer may include an oxide of which dielectric constant is higher than that of the first blocking insulating layer. As an embodiment, the second blocking insulating layer may include metal oxide such as an aluminum oxide layer. The second blocking insulating layer may extend between the conductive pattern CP and the interlayer insulating layer ILD adjacent to each other in the third direction.

According to the above-described structure, the memory cell MC shown in FIG. 2 may be defined at an intersection of the channel layer CH and the conductive pattern CP used as the word line. In addition, the drain select transistor DST shown in FIG. 2 may be defined at an intersection of the channel layer CH and the conductive pattern CP used as the first drain select line or the second drain select line. In addition, the source select transistor SST shown in FIG. 2 may be defined at an intersection of the channel layer CH and the conductive pattern CP used as the source select line. The source select transistor SST, the memory cell MC, and the drain select transistor DST may be connected in series by the channel layer CH, and may configure the memory cell string CS.

According to an embodiment of the present disclosure, the discharge contact 137 may be connected to the doped semiconductor layer 163 via at least one of the sacrificial layer 203, the lower source layer 131, and the upper source layer 133 in contact with the sidewall of the discharge contact 137. In an embodiment, the discharge contact 137 may be used as a path for discharging a charge generated during the process of manufacturing the semiconductor memory device to the discharge impurity region 101DI. In addition, in an embodiment, the discharge contact 137 may be used as a path for discharging a charge accumulated in the memory cell string CS to the discharge impurity region 101DI.

In an embodiment, the insulating pattern 130A disposed between the discharge contact 137 and the slit 161 may protect the discharge contact 137 from an etching process while the semiconductor memory device is manufactured. Hereinafter, a method of manufacturing a semiconductor memory device according to an embodiment of the present disclosure is described.

FIGS. 6, 7, 8, 9, 10A, 10B, 10C, 10D, 11A, 11B, 11C, 11D, 12A, 12B, 12C, 12D, 13A, 13B, 13C, and 13D are cross-sectional views illustrating a method of manufacturing a semiconductor memory device according to an embodiment of the present disclosure. Hereinafter, a repetitive description of the configurations repeated to those in FIGS. 3, 4 and 5A to 5D is omitted.

Figure 6:
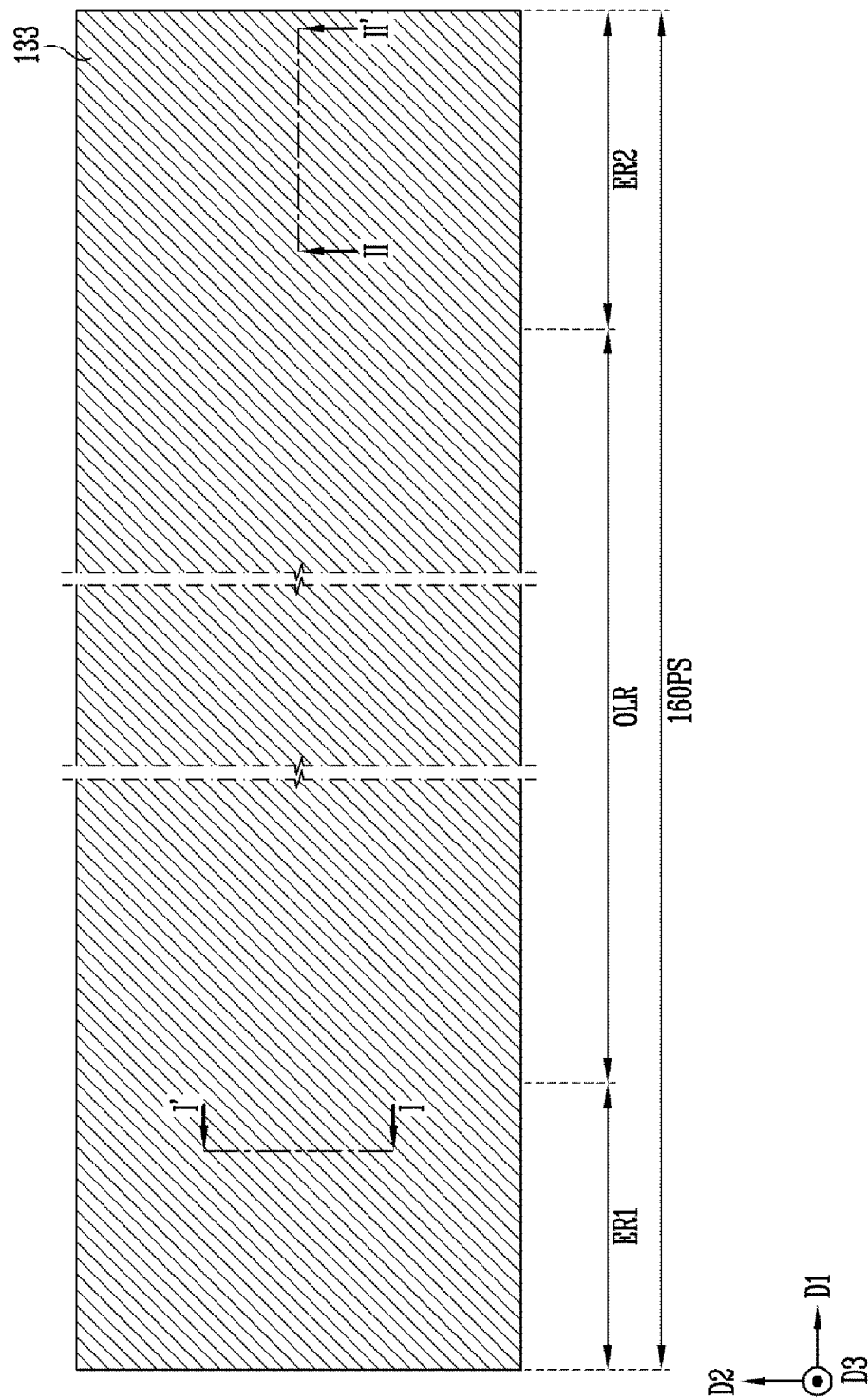
FIGS. 6, 7, 8, 9, 10A, 10B, 10C, 10D, 11A, 11B, 11C, 11D, 12A, 12B, 12C, 12D, 13A, 13B, 13C, and 13D are cross-sectional views illustrating a method of manufacturing a semiconductor memory device according to an embodiment of the present disclosure.
Figure 7:
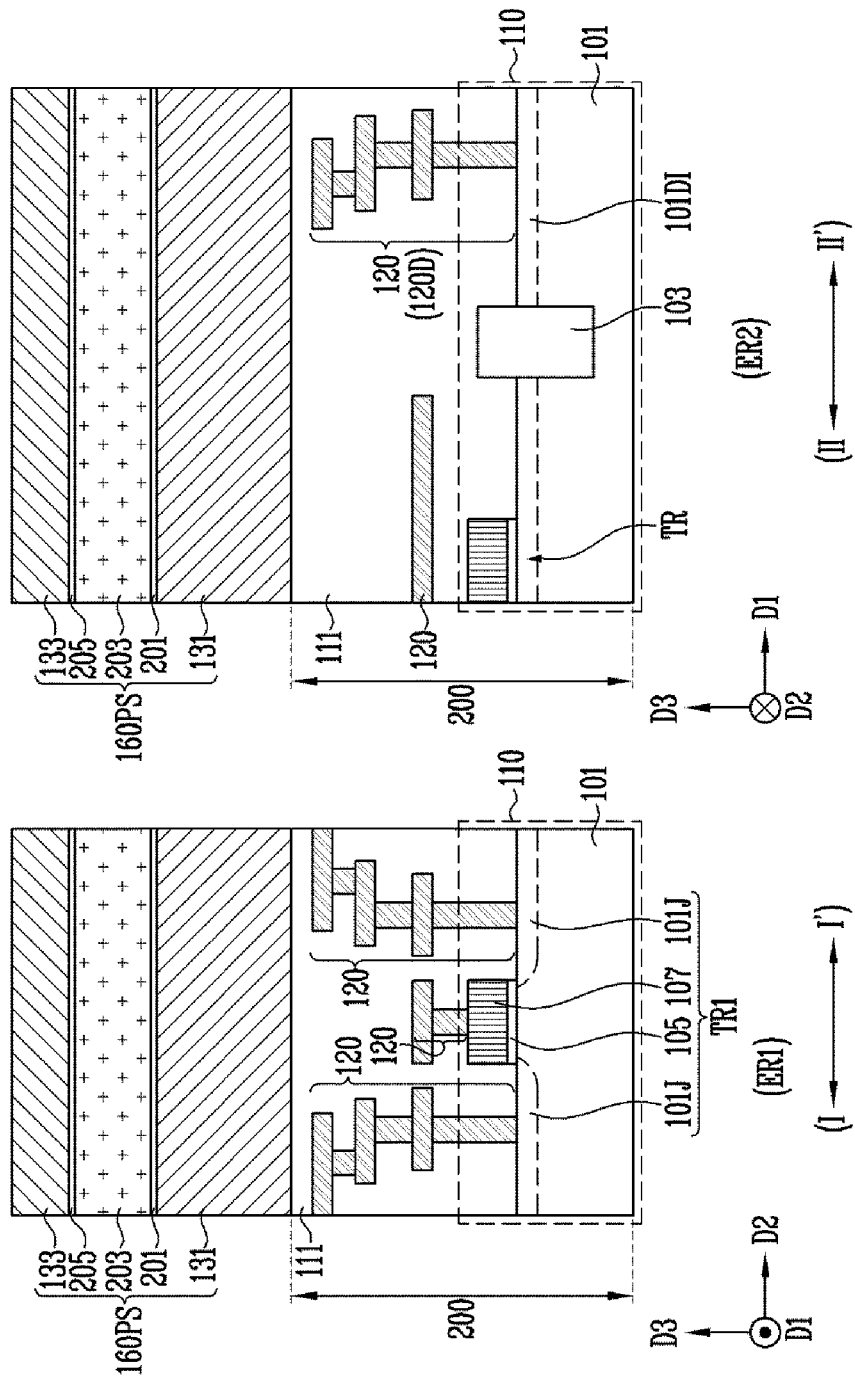

FIGS. 6 and 7 are plan and cross-sectional views illustrating forming a preliminary source structure 160PS. FIG. 7 illustrates a cross-sectional view of the first extension region ER1 of the preliminary source structure 160PS taken along a line I-I' shown in FIG. 6, and a cross-sectional view of the second extension region ER2 of the preliminary source structure 160PS taken along a line II-II' shown in FIG. 6.

Referring to FIGS. 6 and 7, the preliminary source structure 160PS may be formed on a lower structure 200. The lower structure 200 may include the semiconductor substrate 101, the peripheral circuit structure 110, the lower insulating structure covering the semiconductor substrate 101 and the peripheral circuit structure 110, and the plurality of interconnections 120 buried in the lower insulating structure 111.

A plurality of isolation layers 103 may be buried in the semiconductor substrate 101. The isolation layer 103 may insulate adjacent junction regions 101J from each other or may insulate at least one junction region 101J and a discharge impurity region 101DI adjacent to the at least one junction region 101J from each other. Each of the junction regions 101J and the discharge impurity region 101DI may include at least one of an n-type impurity and a p-type impurity. As an embodiment, the discharge impurity region 101DI may include a p-type impurity.

The peripheral circuit structure 110 may include the plurality of transistors TR. Each transistor TR may include the gate insulating layer 105, the gate electrode 107, and the junction regions 101J as described with reference to FIGS. 5A to 5C.

The lower insulating structure 111 may cover the plurality of transistors TR and the semiconductor substrate 101. Each interconnection 120 may include the plurality of conductive patterns buried in the lower insulating structure 111 and connected to each other as described with reference to FIGS. 5A to 5D. The plurality of interconnections 120 may include the discharge interconnection 120D connected to the discharge impurity region 101DI.

Forming the preliminary source structure 160PS may include sequentially stacking the lower source layer 131, the first protective layer 201, the sacrificial layer 203, the second protective layer 205, and the upper source layer 133 on the lower structure 200. The preliminary source structure 160PS may include the gate overlap region OLR and the first extension region ER1 and the second extension region ER2 extending in different directions from the gate overlap region OLR. Each of the lower source layer 131, the first protective layer 201, the sacrificial layer 203, the second protective layer 205, and the upper source layer 133 may be considered to include the gate overlap region OLR, the first extension region ER1, and the second extension region ER2 similarly to the preliminary source structure 160PS.

The lower source layer 131 may include various conductive materials. As an embodiment, the lower source layer 131 may include a doped semiconductor layer doped with an n-type impurity.

The first protective layer 201 and the second protective layer 205 may include a material having an etch selectivity different from that of the sacrificial layer 203. As an embodiment, the first protective layer 201 and the second protective layer 205 may include an oxide layer, and the sacrificial layer 203 may include an undoped semiconductor layer. For example, the sacrificial layer 203 may include undoped silicon.

The upper source layer 133 may include at least one of a metal, an undoped semiconductor layer, and a doped semiconductor layer.

Figure 8:
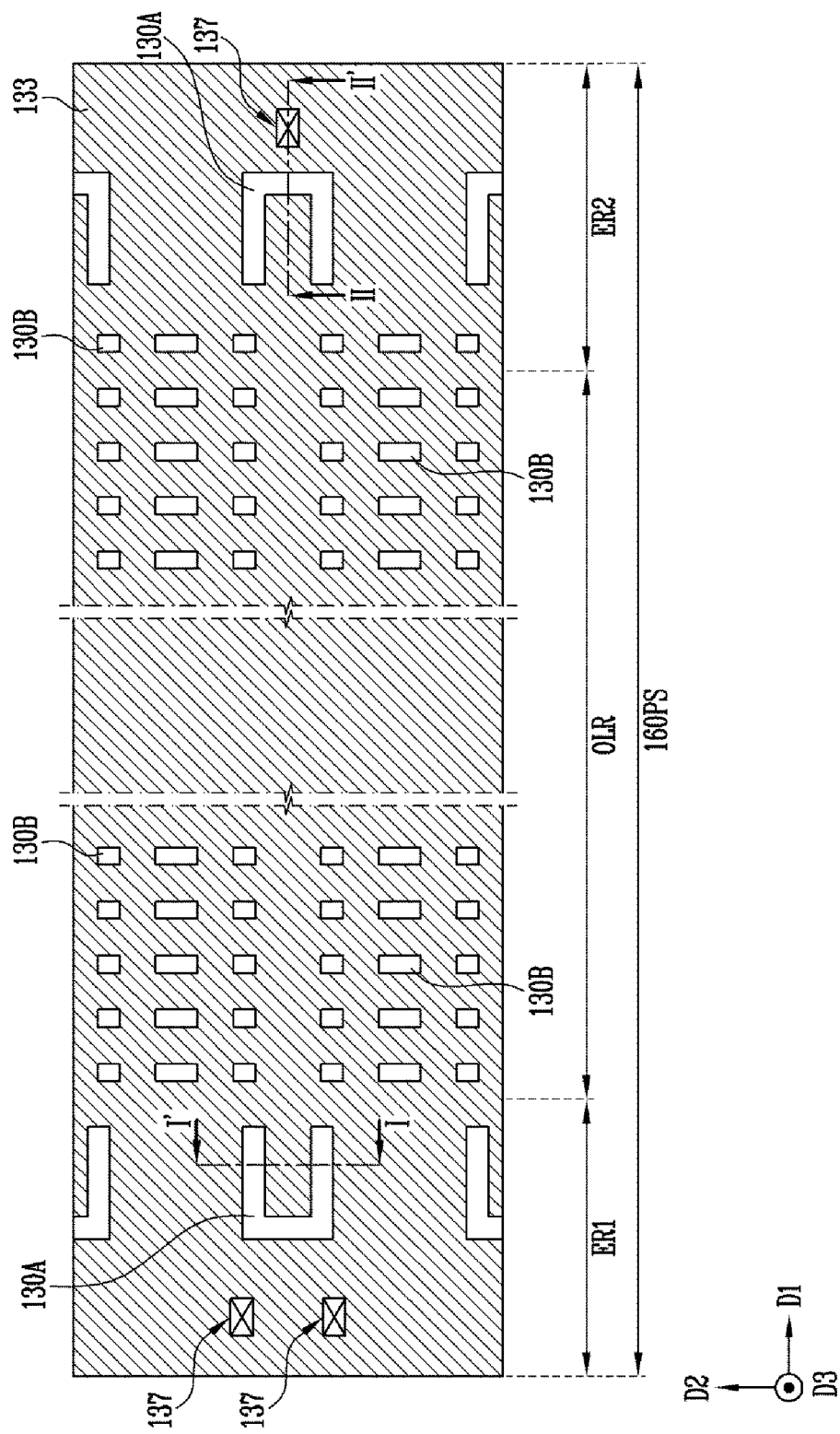
Figure 9:
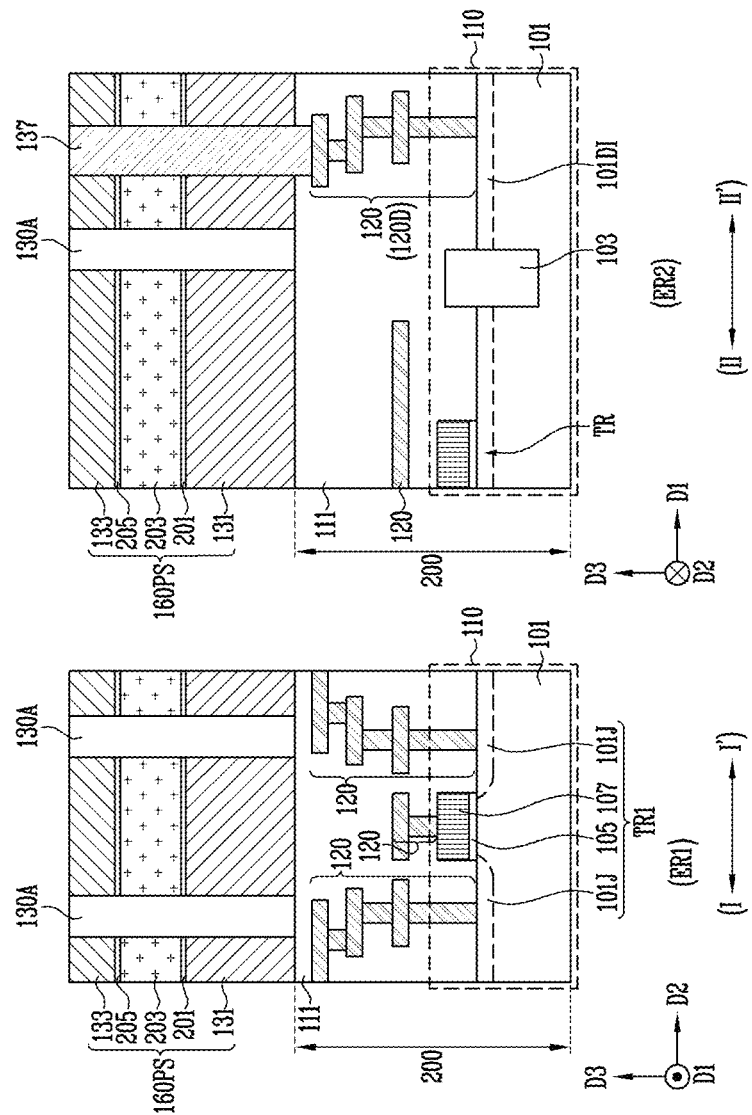

FIGS. 8 and 9 are plan and cross-sectional views illustrating forming the discharge contact 137 and forming the insulating pattern 130A and the first insulating pillar 130B. FIG. 9 illustrates a cross-sectional view of the first extension region ER1 of the preliminary source structure 160PS taken along a line I-I' shown in FIG. 8, and a cross-sectional view of the second extension region ER2 of the preliminary source structure 160PS taken along a line II-II' shown in FIG. 8.

Referring to FIGS. 8 and 9, the discharge contact 137 passing through at least one of the first extension region ER1 and the second extension region ER2 of the preliminary source structure 160PS may be formed. The discharge contact 137 may extend in the third direction D3 to pass through the lower source layer 131, the first protective layer 201, the sacrificial layer 203, the second protective layer 205, and the upper source layer 133 of the preliminary source structure 160PS. The discharge contact 137 may be formed to be in contact with the discharge interconnection 120D among the plurality of interconnections 120. The discharge contact 137 may include various conductive materials. As an embodiment, the discharge contact 137 may include a metal, or may include a metal barrier layer and a metal layer on the metal barrier layer.

The insulating pattern 130A may be disposed between the discharge contact 137 and the gate overlap region OLR of the preliminary source structure 160PS, and may pass through at least one of the first extension region ER1 and the second extension region ER2 of the preliminary source structure 160PS. While forming the insulating pattern 130A, the plurality of first insulating pillars 130B passing through the preliminary source structure 160PS may be formed. The preliminary source structure 160PS may remain to surround the insulating pattern 130A and sidewalls of each of the plurality of first insulating pillars 130B. Each of the insulating pattern 130A and the plurality of first insulating pillars 130B may extend in the third direction D3 to pass through the lower source layer 131, the first protective layer 201, the sacrificial layer 203, the second protective layer 205, and the upper source layer 133 of the preliminary source structure 160PS.

Figure 10A:
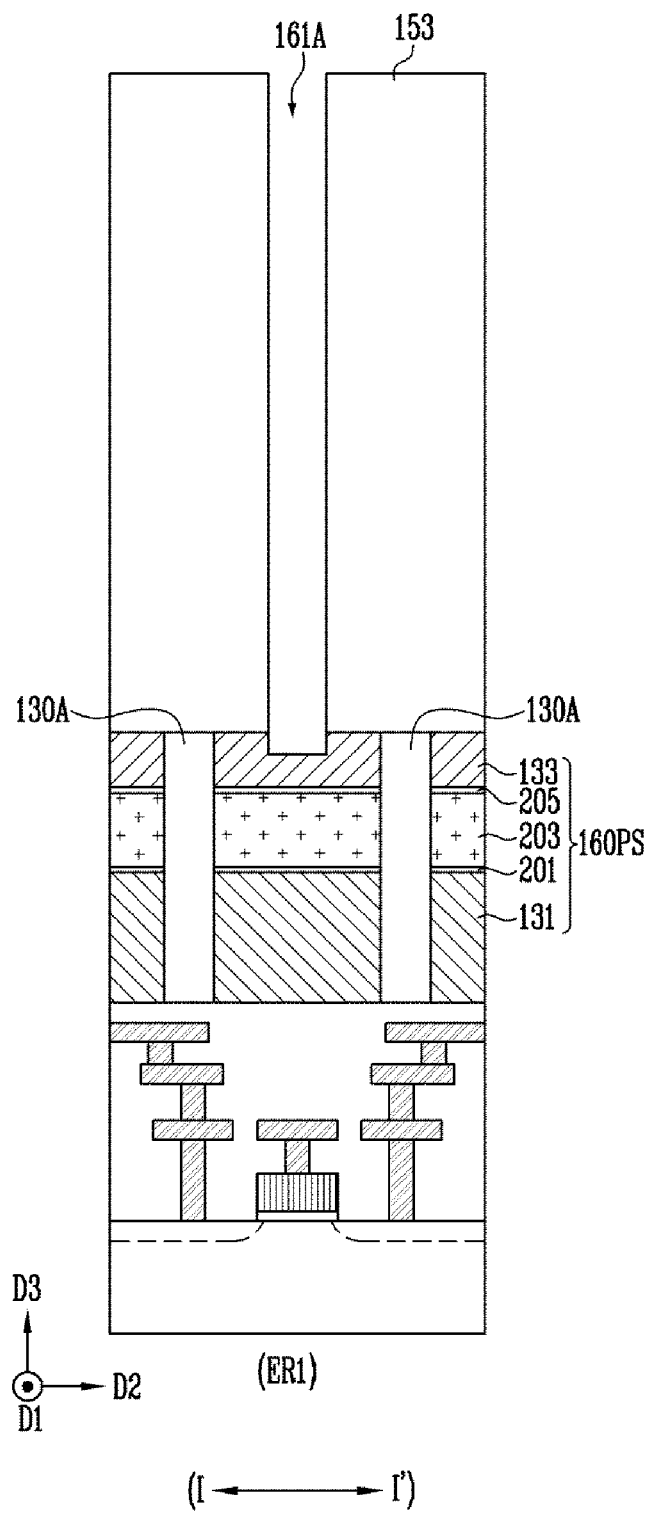
Figure 10B:
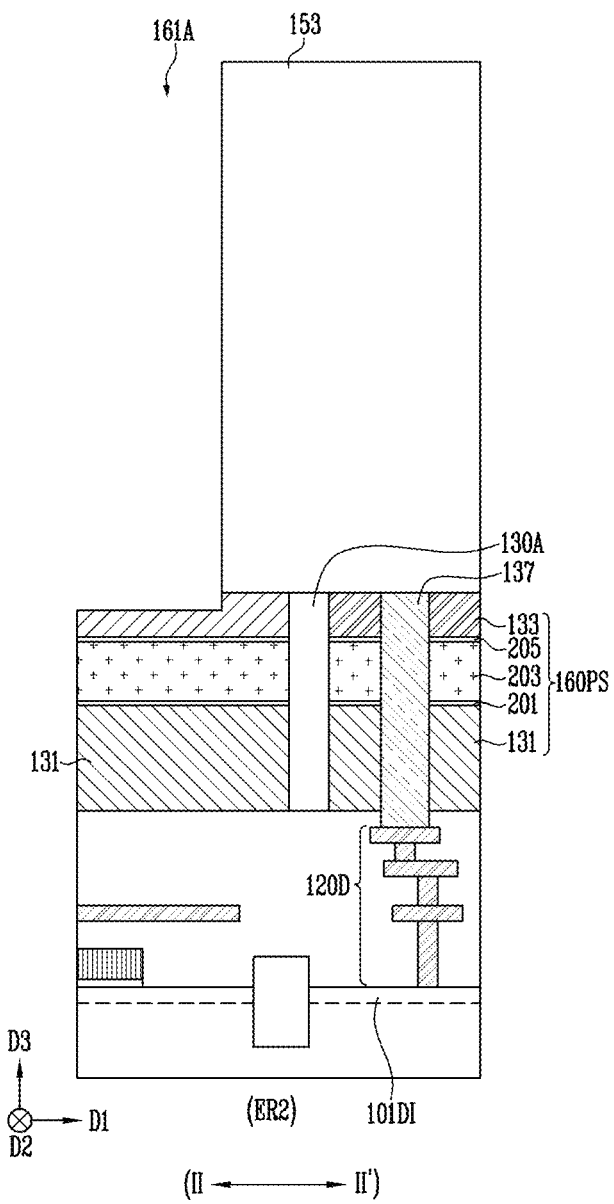
Figure 10C:
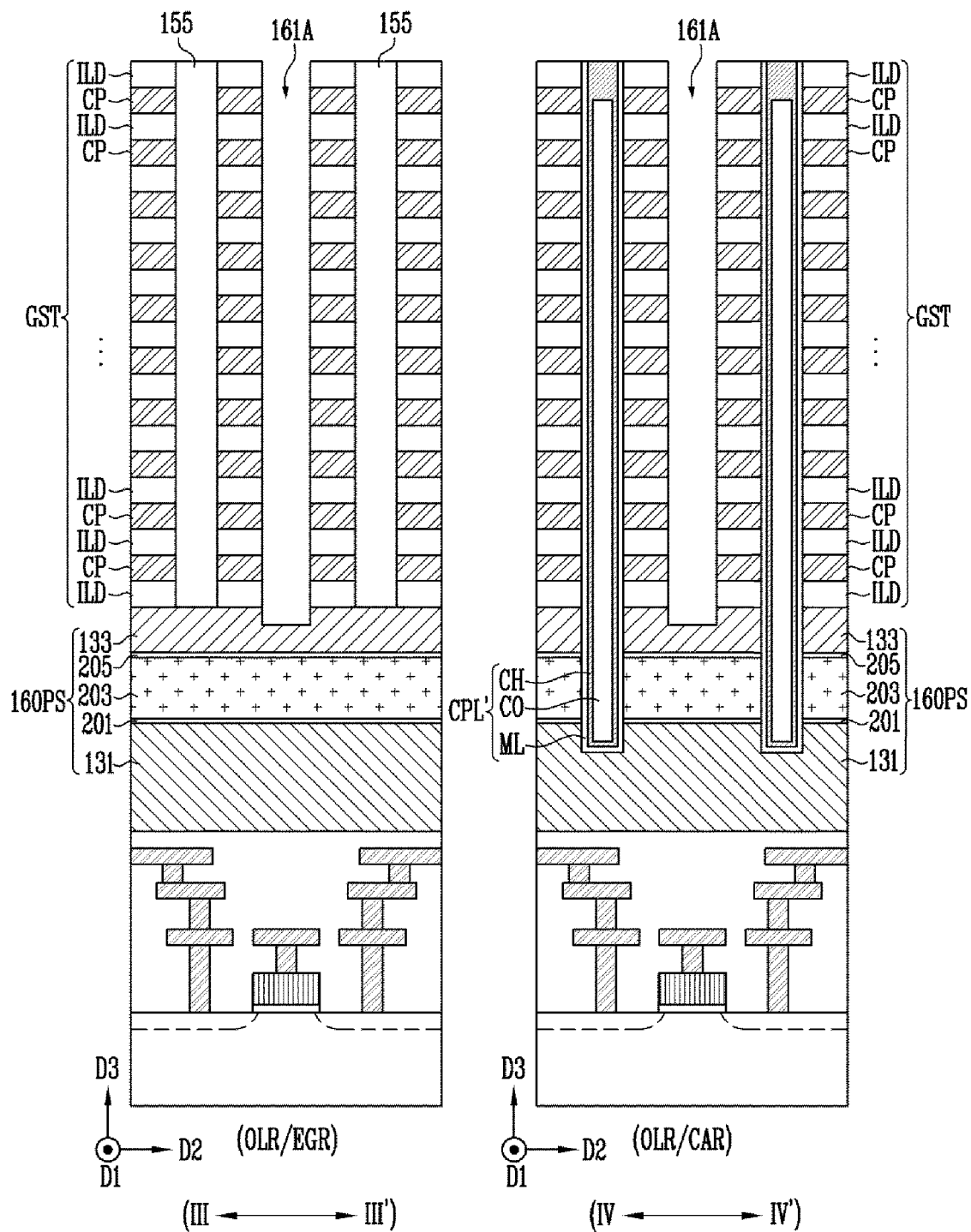
Figure 10D:
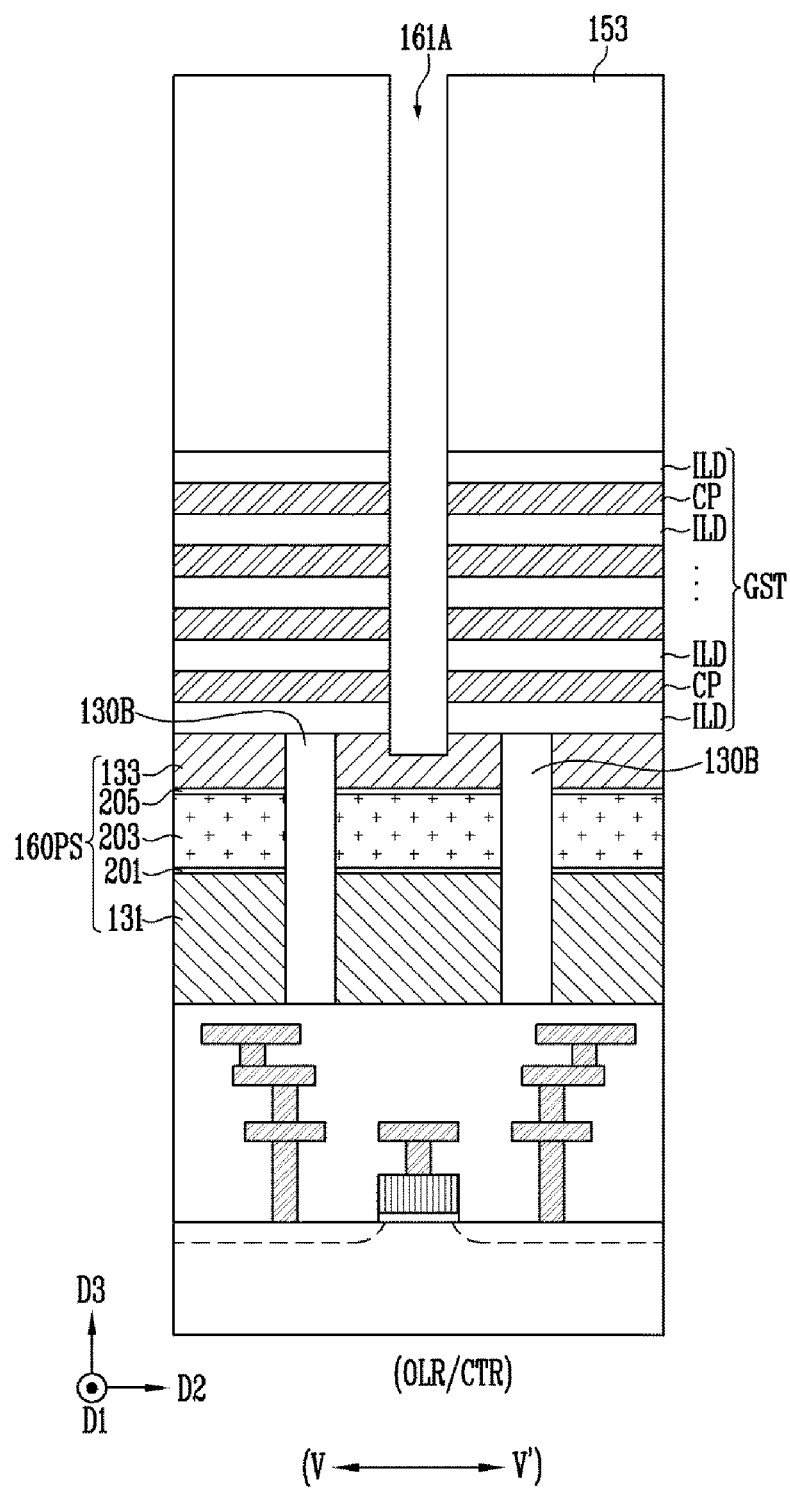

FIGS. 10A, 10B, 10C, and 10D are cross-sectional views illustrating forming the gate stack GST surrounding a plurality of preliminary cell plugs CPL' and penetrated by an upper slit 161A. FIG. 10A illustrates a cross-sectional view of the first extension region ER1 of the preliminary source structure 160PS corresponding to the cross-sectional view taken along the line I-I' shown in FIG. 3. FIG. 10B illustrates a cross-sectional view of the second extension region ER2 of the preliminary source structure 160PS corresponding to the cross-sectional view taken along the line II-II' of FIG. 3. FIG. 10C illustrates a cross-sectional view of the gate overlap region OLR of the preliminary source structure 160PS and the edge region EGR of the gate stack GST overlapping the gate overlap region OLR corresponding to the cross-sectional view taken along the line III-III' shown in FIG. 3, and a cross-sectional view of the gate overlap region OLR of the preliminary source structure 160PS and the memory cell array region CAR of the gate stack GST overlapped the gate overlap region OLR corresponding to the cross-sectional view taken along the line IV-IV' shown in FIG. 3. FIG. 10D illustrates a cross-sectional view of the gate overlap region OLR of the preliminary source structure 160PS and the contact region CTR of the gate stack GST overlapping the gate overlap region OLR corresponding to the cross-sectional view taken along the line V-V' shown in FIG. 3.

Referring to FIGS. 10A to 10D, forming the gate stack GST according to an embodiment may include alternately stacking a plurality of first material layers and a plurality of second material layers on the preliminary source stack 160PS, forming preliminary cell plugs CPL' passing through the plurality of first material layers and the plurality of second material layers, forming a stepped stack by etching the plurality of first material layers and the plurality of second material layers, forming the upper insulating layer 153 covering the stepped stack, and forming the upper slit 161A passing through the stepped stack. According to materials of the first material layer and the second material layer, forming the gate stack GST may further include replacing at least one of the first material layer and the second material layer with a third material layer.

As an embodiment, the first material layer may be formed of a material for the interlayer insulating layer ILD, and the second material layer may be formed of a material having an etch selectivity with respect to the first material layer. For example, the first material layer may include an oxide such as a silicon oxide layer, and the second material layer may include a nitride layer such as a silicon nitride layer. In this case, the second material layer may be replaced with the third material layer through the upper slit 161A. The third material layer may be formed of a material for the conductive pattern CP. Replacing the second material layer with the third material layer for the conductive pattern CP may include removing the second material layer through the upper slit 161A. At this time, a gate region between the first material layers adjacent in the third direction D3 may be opened. Before removing the second material layer, the plurality of second insulating pillars 155 passing through the first material layer and the second material layer may be further formed to maintain a gap in the gate region.

An embodiment of the present disclosure is not limited to that described above. For example, the first material layer may be formed of a material for the interlayer insulating layer ILD, and the second material layer may be formed of a material for the conductive pattern CP.

The conductive pattern CP may be formed of various conductive materials. As an embodiment, the conductive pattern CP may include at least one of a metal, a metal barrier layer, and a doped semiconductor layer. For example, the conductive pattern CP may be formed of a single metal layer, may be formed of a metal layer and a metal barrier layer surrounding a surface of the metal layer, or may be formed of a doped semiconductor layer and a metal layer.

Forming the preliminary cell plug CPL' may include forming a channel hole passing through the plurality of first material layers and the plurality of second material layers on the gate overlap region OLR, forming a memory layer ML along a surface of the channel hole, forming a semiconductor layer along a surface of the memory layer ML, and filling a central region of the channel hole opened by the semiconductor layer with a core insulating layer CO and a doped semiconductor layer. The semiconductor layer and the doped semiconductor layer inside the channel hole may configure the channel layer CH. The memory layer ML may include a blocking insulating layer, a data storage layer, and a tunnel insulating layer similarly to the first memory pattern ML1 and the second memory pattern ML2 described with reference to FIGS. 5A to 5D.

The above-described channel hole may pass through the upper source layer 133, the second protective layer 205, the sacrificial layer 203, and the first protective layer 201 of the preliminary source stack 160PS, and may extend into the lower source layer 131. The channel layer CH and the memory layer ML of the preliminary cell plug CPL' may pass through the upper source layer 133, the second protective layer 205, the sacrificial layer 203, and the first protective layer 201 along the channel hole, and may extend into the lower source layer 131.

In order to improve an integration degree of the semiconductor memory device, the number of stacks of the first material layer and the second material layer may be increased. As the number of stacks of the first material layer and the second material layer increases, high power may be applied to a semiconductor manufacturing equipment during an etching process of the first material layer and the second material layer for forming a channel hole. A charge may be accumulated in the preliminary source structure 160PS by the high power applied to the semiconductor manufacturing equipment. While etching the first material layer and the second material layer, a ground voltage may be applied to the discharge impurity region 101DI of the semiconductor substrate 101 from a supporter (not shown) of the semiconductor manufacturing equipment. Accordingly, the charge accumulated in the preliminary source structure 160PS may be discharged through the discharge impurity region 101DI via the discharge contact 137. Accordingly, in an embodiment, an arcing phenomenon may be improved.

Through the above-described processes, the gate stack GST including the memory cell array region CAR, the edge region EGR, and the contact region CTR may be defined on the preliminary source stack 160PS. In addition, the gate stack GST may include the plurality of interlayer insulating layers ILD and the plurality of conductive patterns CP alternately stacked on the preliminary source stack 160PS. The edge region EGR of the gate stack GST may be defined as a region adjacent to the first extension region ER1 of the preliminary source stack 160PS, and the contact region CTR of the gate stack GST may be adjacent to the second extension region ER2 of the preliminary source stack 160PS and may have a stepped structure. The memory cell array region of the gate stack GST may be penetrated by the preliminary cell plugs CPL'.

The upper slit 161A may extend to pass through a portion of the upper insulating layer 153. The upper source layer 133 may serve as an etch stop layer during an etching process for forming the upper slit 161A. The upper slit 161A may be disposed at a distance from the insulating pattern 130A.

A preliminary dummy plug for the dummy plug DPL shown in FIG. 3 may be formed using the process of forming the preliminary cell plugs CPL' described above. After forming the preliminary cell plugs CPL' and the conductive pattern CP described above, an etching process for forming the drain separation slit DSI shown in FIG. 3 and a process of filling the drain separation slit DSI with an insulating layer may be performed.

Figure 11A:
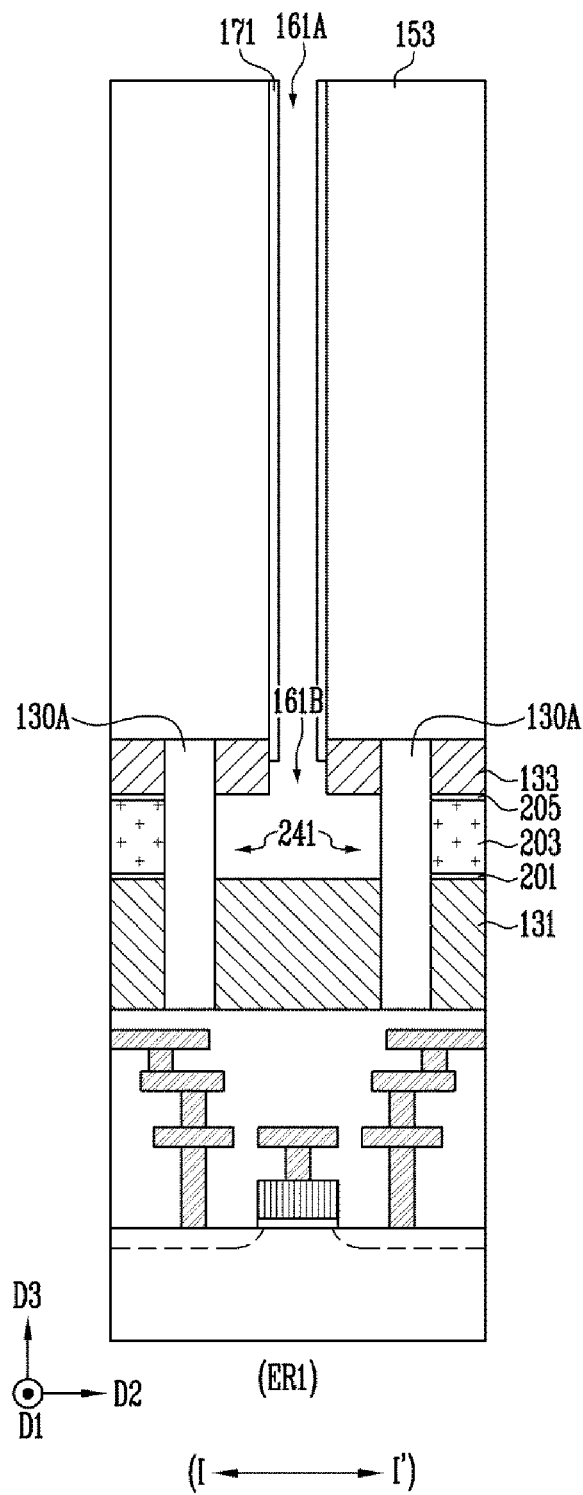
Figure 11B:
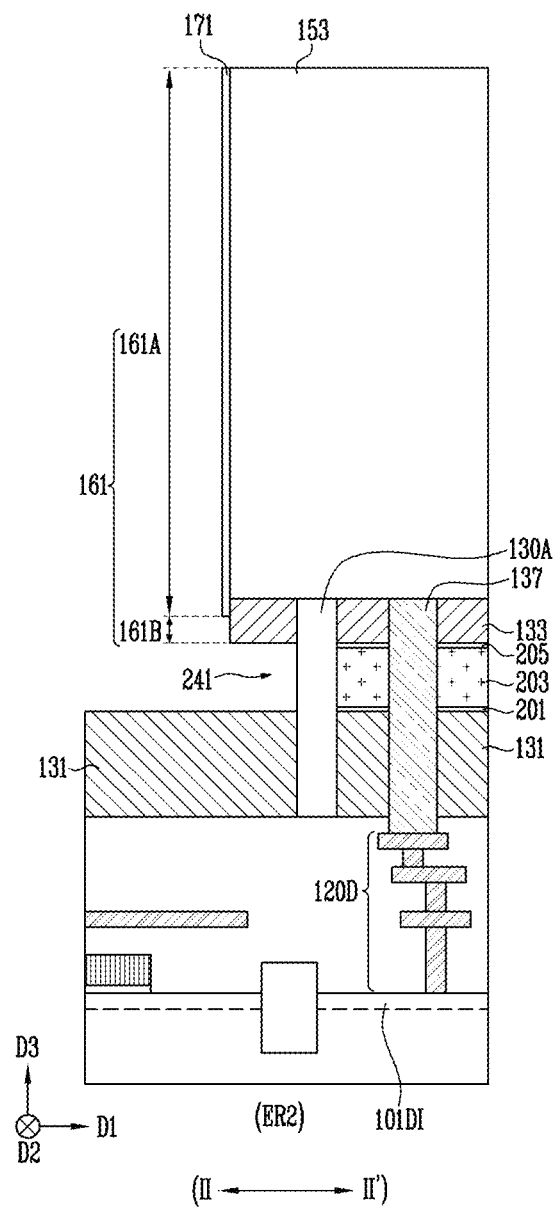
Figure 11C:
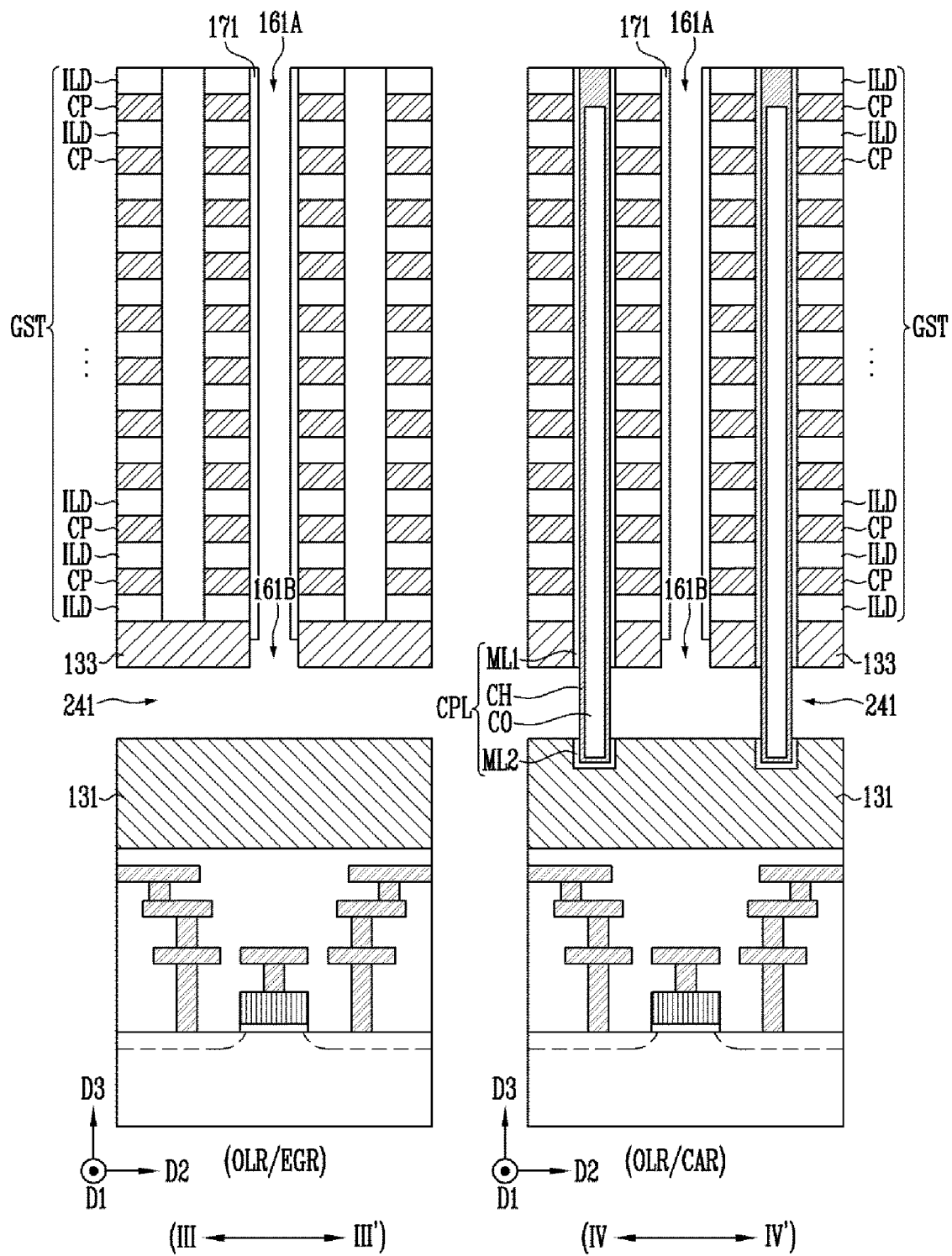
Figure 11D:
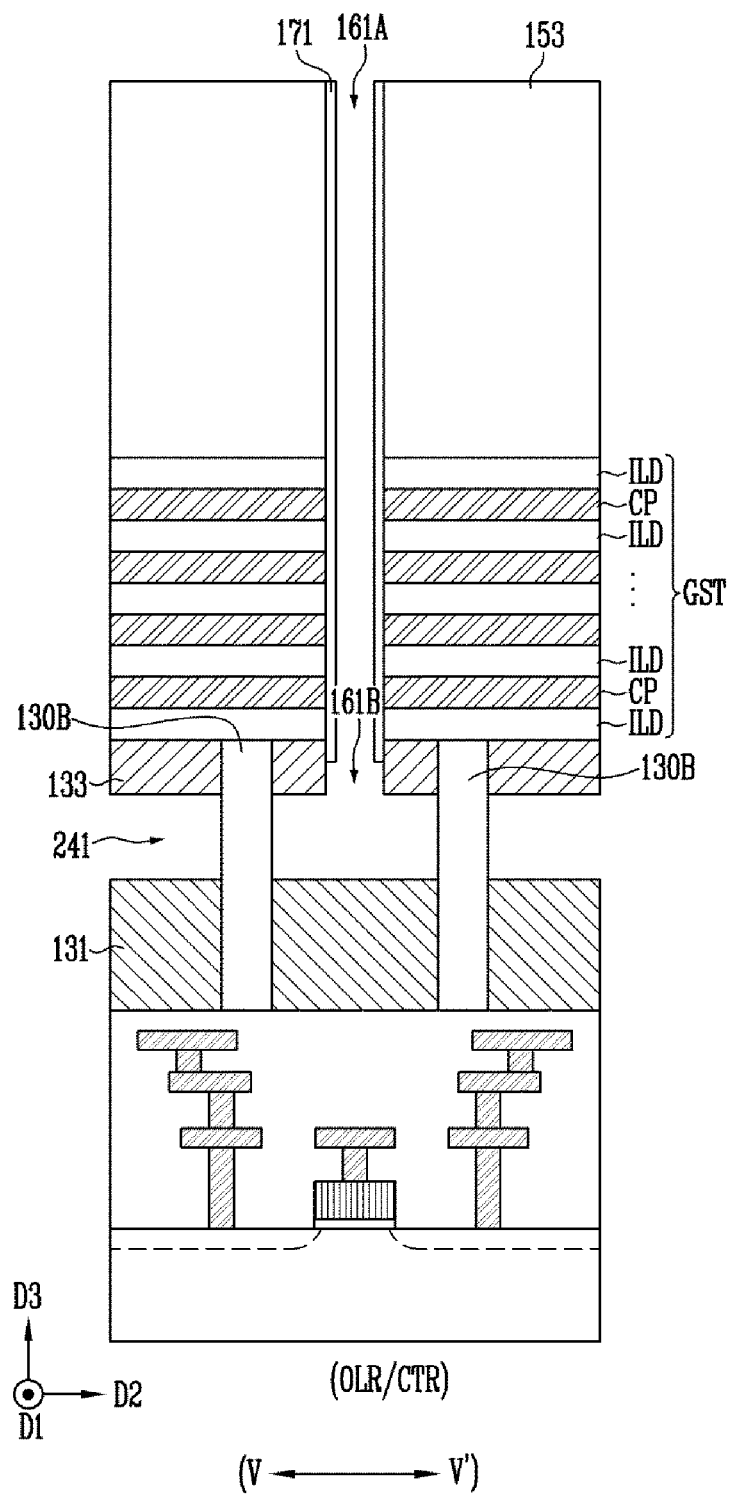

FIGS. 11A, 11B, 11C, and 11D are cross-sectional views illustrating forming a lower slit 161B and exposing the sidewall of the channel layer CH. FIG. 11A illustrates a subsequent process for a region shown in FIG. 10A. FIG. 11B illustrates a subsequent process for a region shown in FIG. 10B. FIG. 11C illustrates a subsequent process for regions shown in FIG. 10C. FIG. 11D illustrates a subsequent process for a region shown in FIG. 10D.

Referring to FIGS. 11A to 11D, a spacer insulating layer 171 may be formed on a sidewall of the upper slit 161A. Thereafter, the lower slit 161B may be defined by removing a portion of the upper source layer 133 through the upper slit 161A. The slit 161 may be defined by a connection structure of the upper slit 161A and the lower slit 161B. The slit 161 may be defined at a distance spaced apart from the insulating pattern 130A as shown in FIG. 3 in a plan view.

Thereafter, an etching process such as an etch-back process may be performed through the slit 161 to expose the sacrificial layer 203. Subsequently, an etching process for selectively removing the gate overlap region OLR of the sacrificial layer 203 through the slit 161 may be performed. In an embodiment, an etching material that flows from the slit 161 may be prevented or mitigated from being diffused into the first extension region ER1 and the second extension region ER2 around the discharge contact 137 by the insulating pattern 130A shown in FIG. 9. Accordingly, the first extension region ER1 and the second extension region ER2 of the sacrificial layer 203 may remain to surround the discharge contact 137. In addition, the sacrificial layer 203 may remain in a state in which the sacrificial layer 203 is in contact with one sidewall of the insulating pattern 130A.

As the gate overlap region OLR of the sacrificial layer 203 is removed, the gate overlap region OLR of the first protective layer 201 and the gate overlap region OLR of the second protective layer 205 may be exposed, and the memory layer ML shown in FIG. 10C may be exposed. In addition, another sidewall of the insulating pattern 130A that is not in contact with the sacrificial layer 203 may be exposed.

Thereafter, a portion of the memory layer ML exposed between the lower source layer 131 and the upper source layer 133 may be removed. The gate overlap region OLR of the first protective layer 201 and the gate overlap region OLR of the second protective layer 205 may be removed while a portion of the memory layer ML is removed.

Through the above-described process, a horizontal space 241 between the lower source layer 131 and the upper source layer 133 may be opened, and the sidewall of the channel layer CH may be exposed by the horizontal space 241. In addition, the memory layer ML shown in FIG. 10C may be divided into the first memory pattern ML1 and the second memory pattern ML2 by the horizontal space 241. A gap of the horizontal space 241 may be maintained by the first insulating pillar 130B.

Figure 12A:
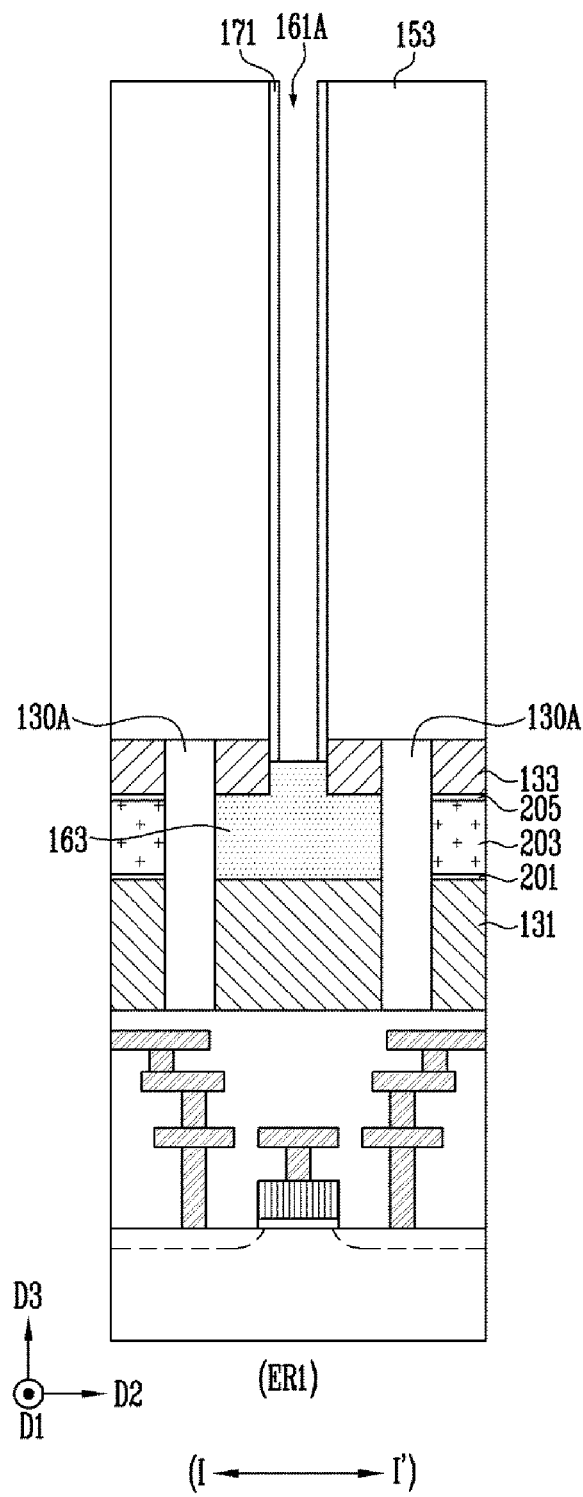
Figure 12B:
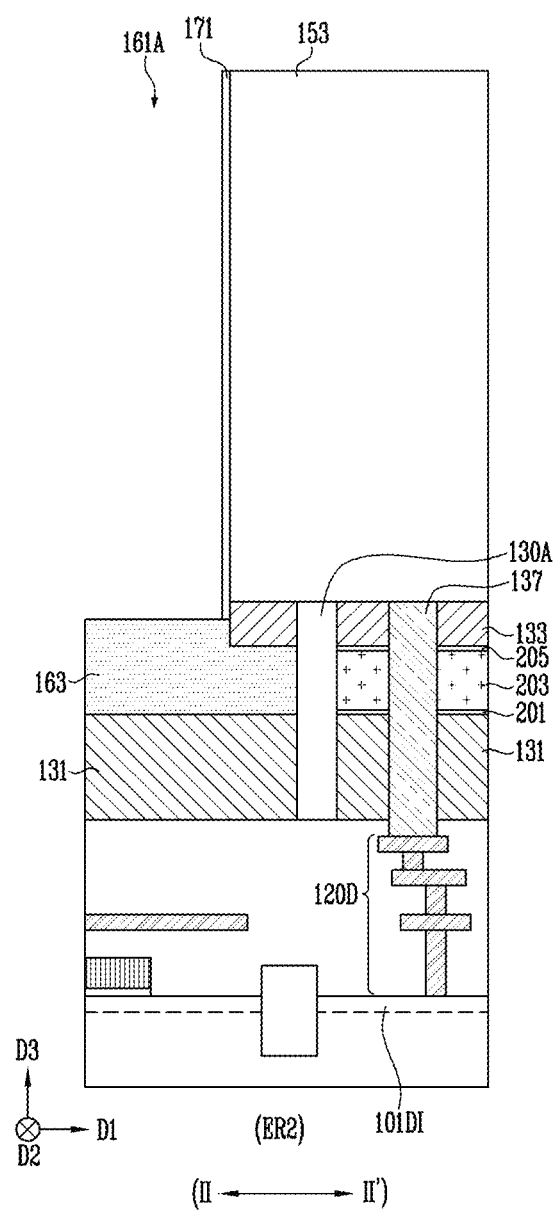
Figure 12C:
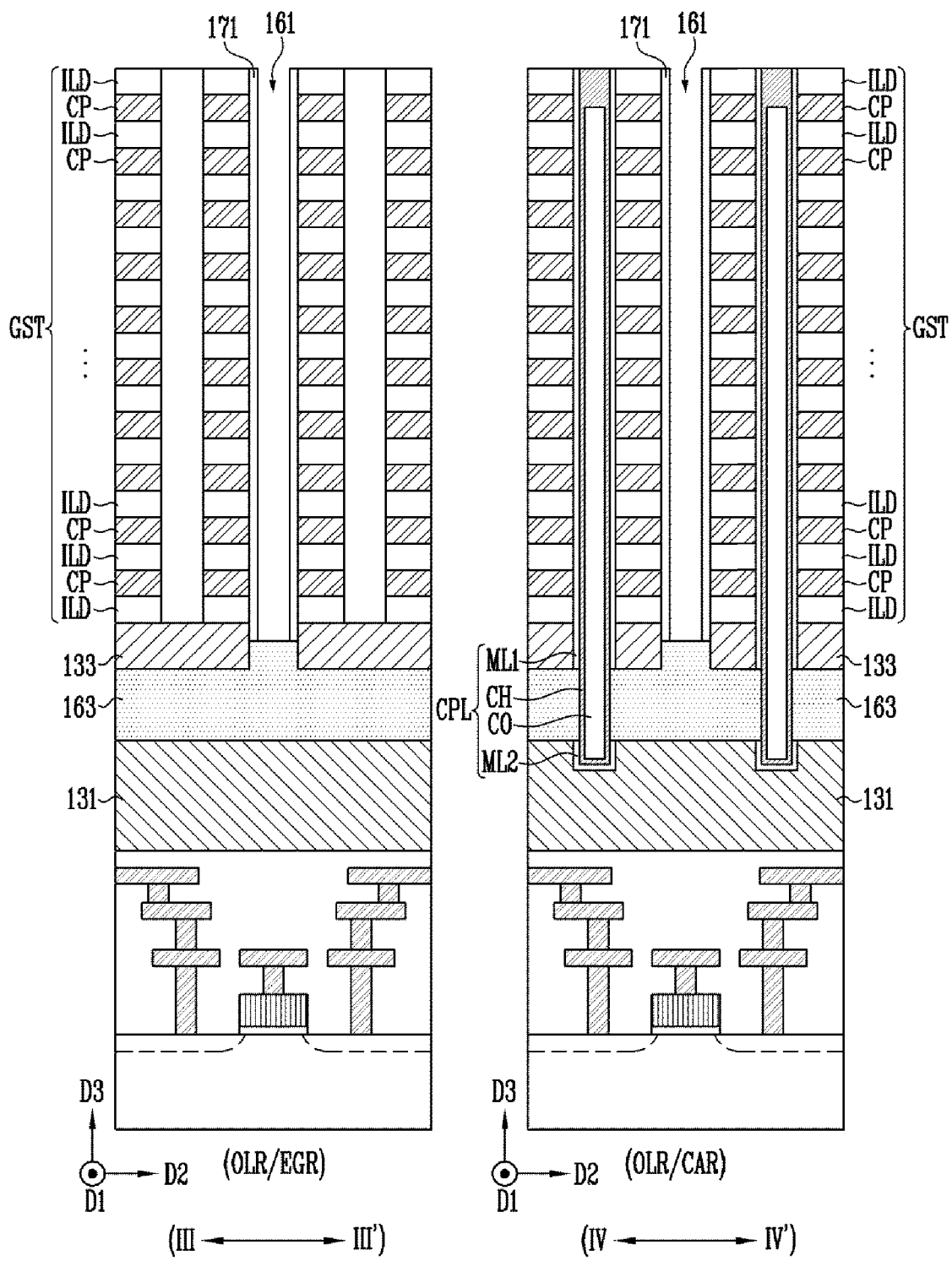
Figure 12D:
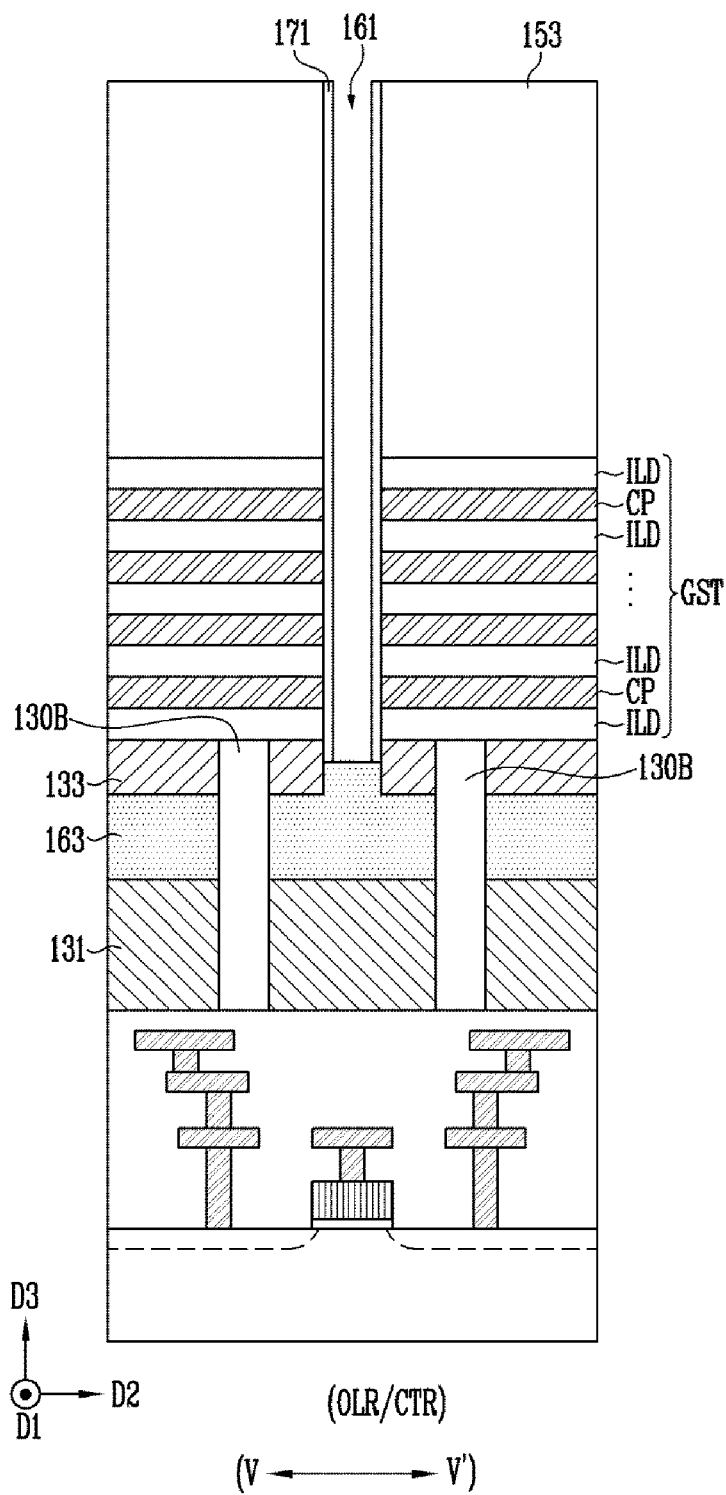

FIGS. 12A, 12B, 12C, and 12D are cross-sectional views illustrating forming the doped semiconductor layer 163. FIG. 12A illustrates a subsequent process for a region shown in FIG. 11A. FIG. 12B illustrates a subsequent process for a region shown in FIG. 11B. FIG. 12C illustrates a subsequent process for regions shown in FIG. 11C. FIG. 12D illustrates a subsequent process for a region shown in FIG. 11D.

Referring to FIGS. 12A to 12D, the horizontal space 241 shown in FIGS. 11A to 11D may be filled with the doped semiconductor layer 163 through the slit 161 shown in FIGS. 11A to 11D. The doped semiconductor layer 163 may include an impurity of a conductivity type different from that of the discharge impurity region 101DI. As an embodiment, the doped semiconductor layer 163 may include an n-type impurity. The doped semiconductor layer 163 may be contact with a portion of a sidewall of the insulating pattern 130A that is not in contact with the sacrificial layer 203. That is, the insulating pattern 130A may have one sidewall that is in contact with the sacrificial layer 203 and another sidewall that is in contact with the doped semiconductor layer 163.

As described with reference to FIGS. 11A to 11D and 12A to 12D, the source structure connected to the channel layer CH may be provided by replacing the gate overlap region OLR of each of the first protective layer 201, the sacrificial layer 203, and the second protective layer 205 with the doped semiconductor layer 163 through the slit 161.

Figure 13A:
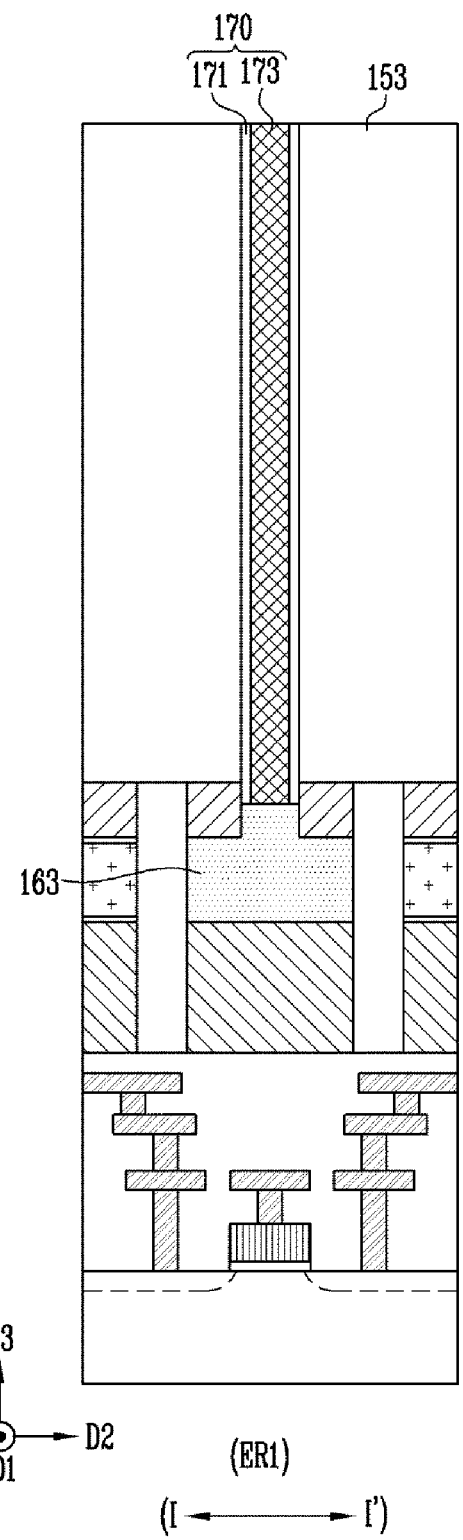
Figure 13B:
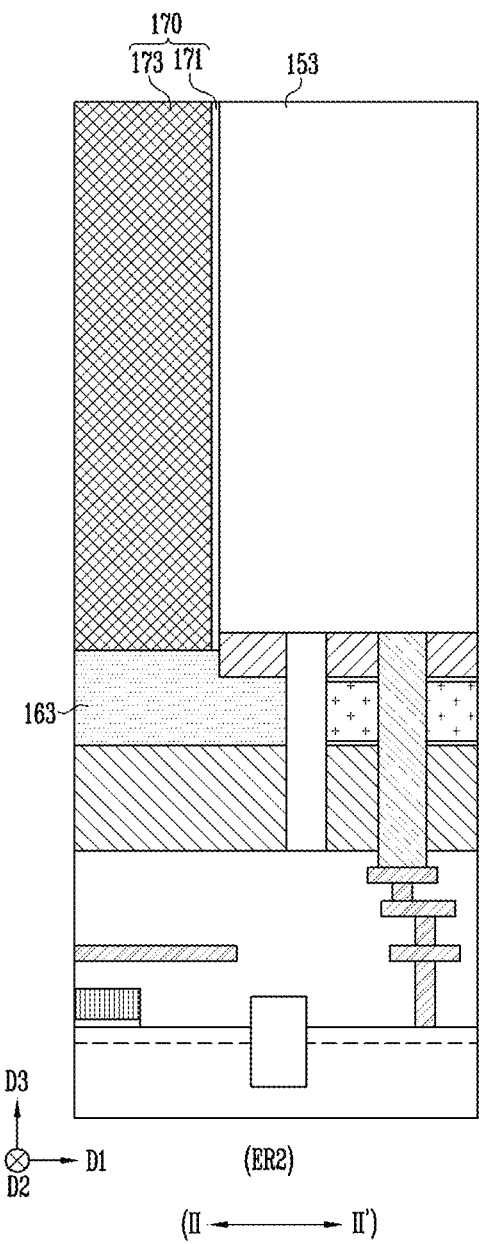
Figure 13C:
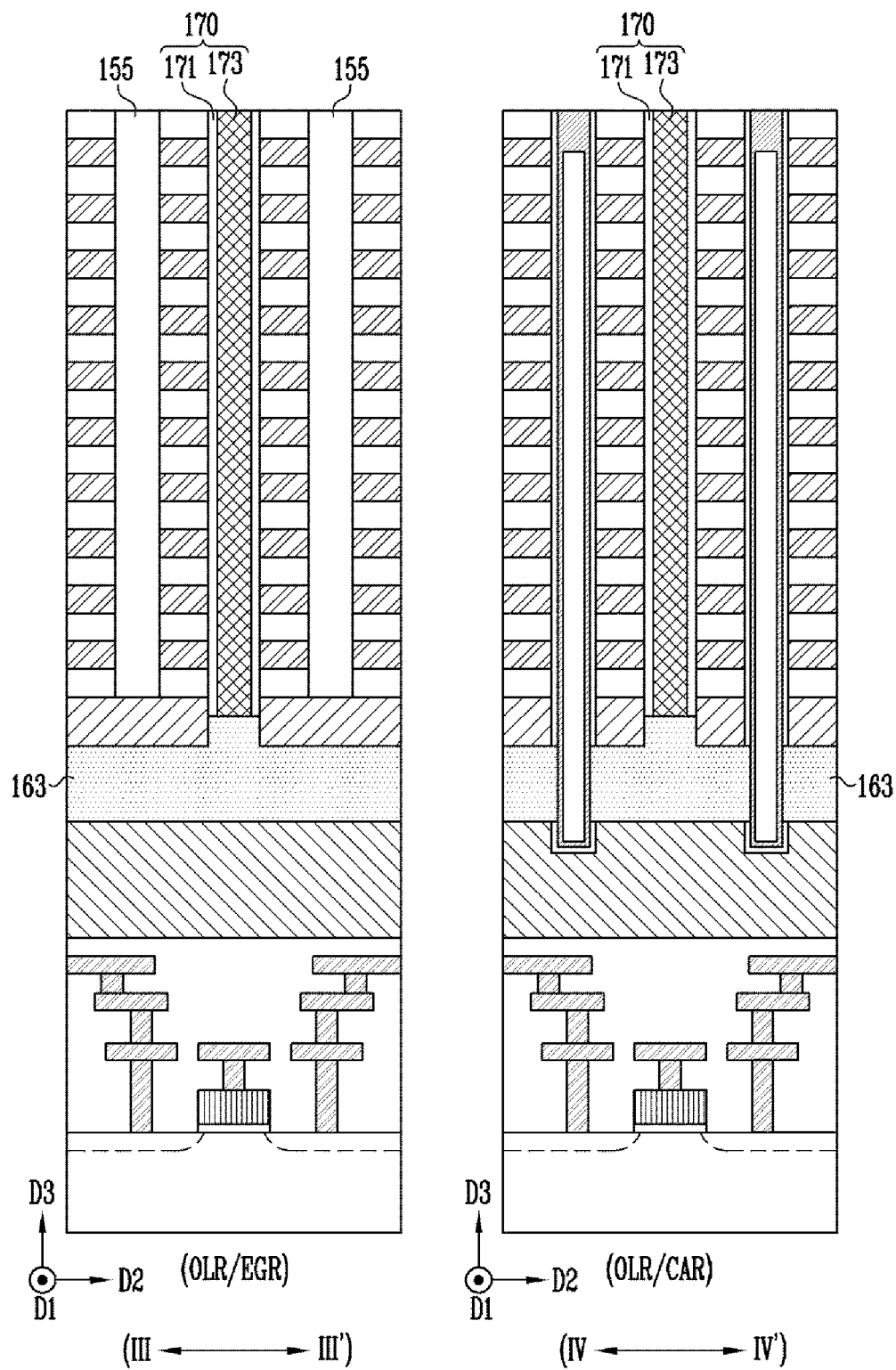
Figure 13D:
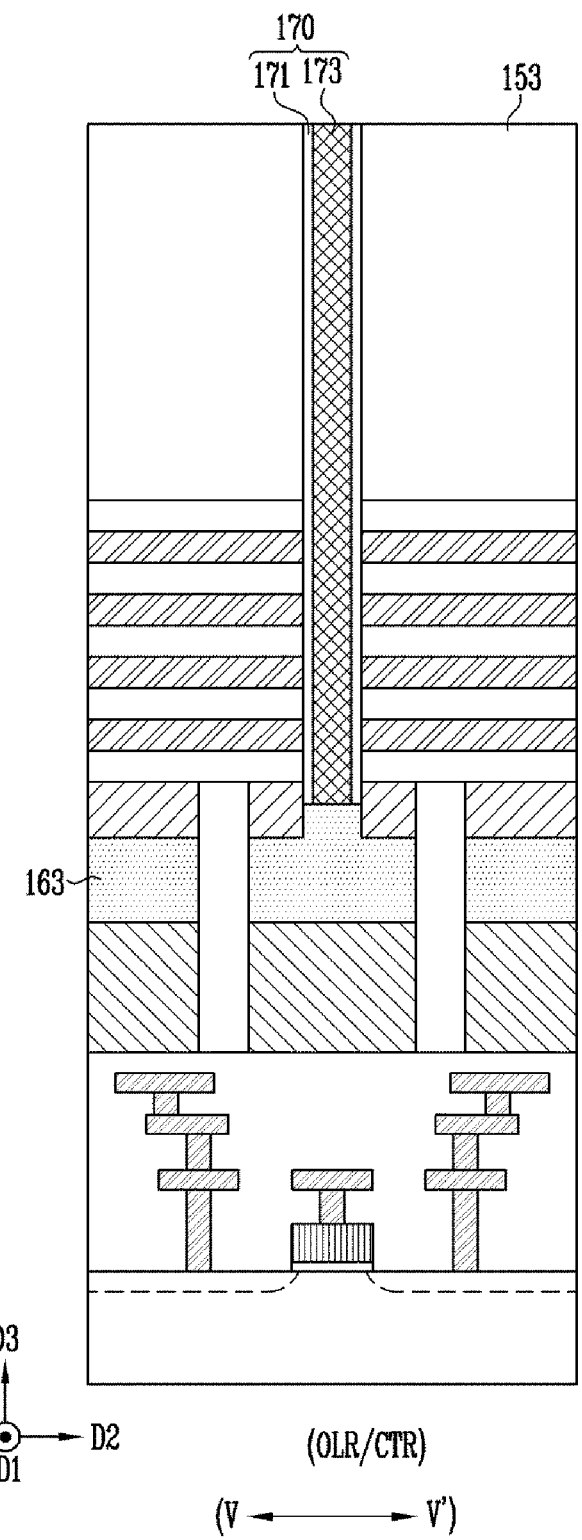

FIGS. 13A, 13B, 13C, and 13D are cross-sectional views illustrating forming the vertical structure 170. FIG. 13A illustrates a subsequent process for a region shown in FIG. 12A. FIG. 13B illustrates a subsequent process for a region shown in FIG. 12B. FIG. 13C illustrates a subsequent process for regions shown in FIG. 12C. FIG. 13D illustrates a subsequent process for a region shown in FIG. 12D.

Referring to FIGS. 13A to 13D, the conductive source contact 173 may be formed in the slit 161 shown in FIGS. 12A to 12D. Accordingly, the vertical structure 170 including the spacer insulating layer 171 and the conductive source contact 173 may be formed.

Thereafter, a subsequent process such as forming the gate contact 177 shown in FIGS. 5A to 5D may be performed.

Figure 14:
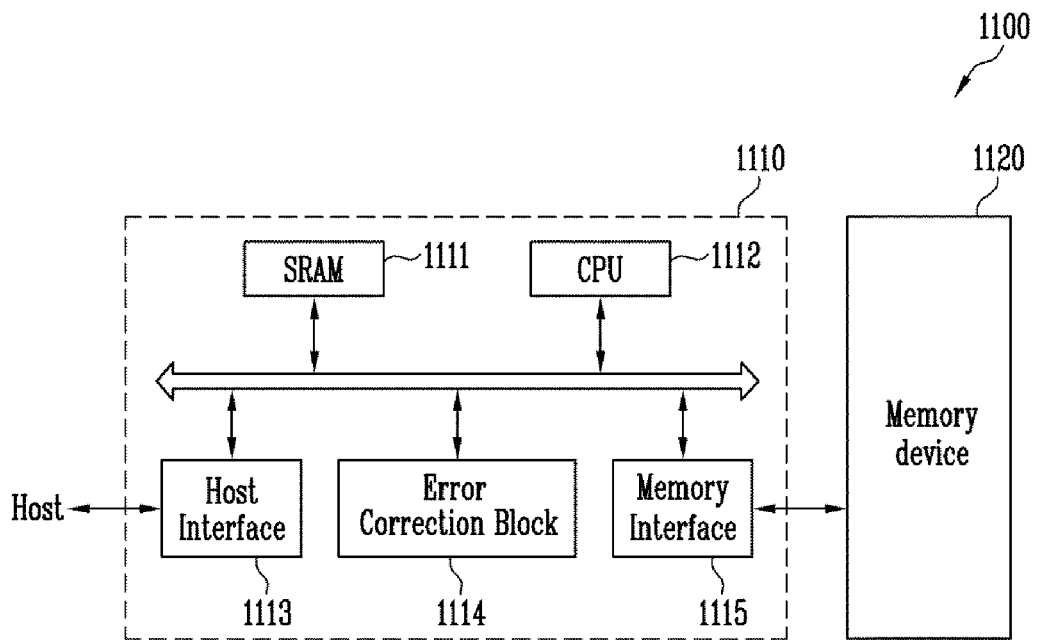
FIG. 14 is a block diagram illustrating a configuration of a memory system according to an embodiment of the present disclosure.

FIG. 14 is a block diagram illustrating a configuration of a memory system according to an embodiment of the present disclosure.

Referring to FIG. 14, the memory system 1100 includes a memory device 1120 and a memory controller 1110.

The memory device 1120 may be a multi-chip package configured of a plurality of flash memory chips. The memory device 1120 may include a discharge contact passing through a source structure, a gate stack disposed on a partial region of the source structure, a vertical structure passing through the gate stack, and an insulating pattern passing through the source structure between the vertical structure and the discharge contact.

The memory controller 1110 may be configured to control the memory device 1120, and may include a static random access memory (SRAM) 1111, a central processing unit (CPU) 1112, a host interface 1113, an error correction block 1114, and a memory interface 1115. The SRAM 1111 is used as an operation memory of the CPU 1112, the CPU 1112 performs an overall control operation for data exchange of the memory controller 1110, and the host interface 1113 include a data exchange protocol of a host connected to the memory system 1100. The error correction block 1114 detects an error included in data read from the memory device 1120 and corrects the detected error. The memory interface 1115 performs interfacing with the memory device 1120. The memory controller 1110 may further include a read only memory (ROM) that stores code data for interfacing with the host.

The above-described memory system 1100 may be a memory card or a solid state drive (SSD) in which the memory device 1120 and the memory controller 1110 are combined. For example, when the memory system 1100 is the SSD, the memory controller 1110 may communicate with the outside (for example, the host) through one of various interface protocols such as a universal serial bus (USB), a multimedia card (MMC), a peripheral component interconnection-express (PCI-E), a serial advanced technology attachment (SATA), a parallel advanced technology attachment (PATA), a small computer system interface (SCSI), an enhanced small disk interface (ESDI), and integrated drive electronics (IDE).

Figure 15:
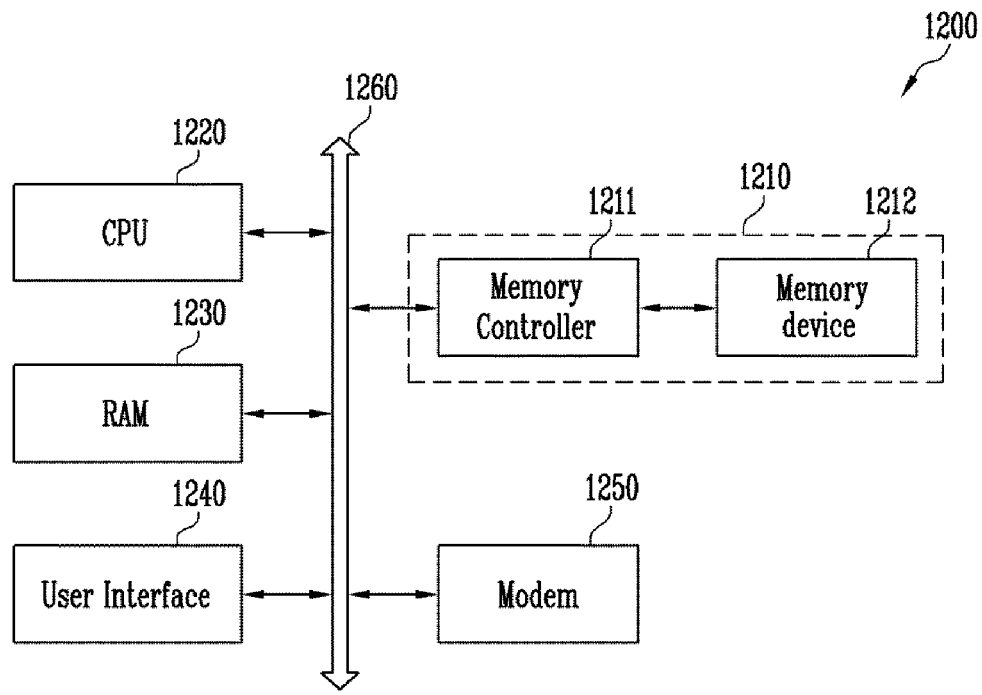
FIG. 15 is a block diagram illustrating a configuration of a computing system according to an embodiment of the present disclosure.

FIG. 15 is a block diagram illustrating a configuration of a computing system according to an embodiment of the present disclosure.

Referring to FIG. 15, the computing system 1200 may include a CPU 1220, a random access memory (RAM) 1230, a user interface 1240, a modem 1250, and a memory system 1210 electrically connected to a system bus 1260. When the computing system 1200 is a mobile device, a battery for supplying an operation voltage to the computing system 1200 may be further included, and an application chipset, an image processor, a mobile DRAM, and the like may be further included.

The memory system 1210 may include a memory device 1212 and a memory controller 1211.

The memory device 1212 may include a discharge contact passing through a source structure, a gate stack disposed on a partial region of the source structure, a vertical structure passing through the gate stack, and an insulating pattern passing through the source structure between the vertical structure and the discharge contact.

The memory controller 1211 may be configured identically to the memory controller 1110 described above with reference to FIG. 14.

According to the present disclosure, in an embodiment, the insulating pattern is disposed inside the source structure to prevent or mitigate damage to the discharge contact while forming the source structure. Accordingly, an embodiment of the present disclosure may improve a connection defect between the source structure and the discharge contact, thereby improving stability of a manufacturing process of the semiconductor memory device.

What is claimed is:
1. A semiconductor memory device comprising:
a source structure including a gate overlap region and an extension region extending from the gate overlap region;
a discharge contact passing through the source structure within the extension region;
a gate stack disposed on the source structure within the gate overlap region;
a vertical structure passing through the gate stack and having an end overlapping the extension region; and
an insulating pattern disposed between the vertical structure and the discharge contact and passing through the source structure within the extension region,
wherein the discharge contact directly contacts a portion of the source structure without intervening an insulat- ing material between a sidewall of the discharge contact and the portion of the source structure.

2. The semiconductor memory device of claim 1, wherein the source structure comprises:
   a source pattern disposed within the gate overlap region; and
   a dummy pattern extending from the source pattern and in contact with a sidewall of the discharge contact, and
   the source pattern and the dummy pattern are comprised in different stack structures.

3. The semiconductor memory device of claim 1, wherein the source structure comprises:
   a lower source layer extending from the gate overlap region to the extension region;
   a first protective layer, a sacrificial layer, and a second protective layer disposed within the extension region and stacked on the lower source layer;
   a doped semiconductor layer disposed within the gate overlap region and disposed on the lower source layer; and
   an upper source layer disposed on the doped semiconductor layer and extending to overlap the second protective layer.

4. The semiconductor memory device of claim 3, wherein the sidewall of the discharge contact is surrounded by the lower source layer, the first protective layer, the sacrificial layer, the second protective layer, and the upper source layer, and
   wherein the discharge contact is connected to the doped semiconductor layer via at least one of the sacrificial layer, the lower source layer, and the upper source layer.

5. The semiconductor memory device of claim 3, wherein the discharge contact is spaced apart from the doped semiconductor layer.

6. The semiconductor memory device of claim 1, wherein the insulating pattern extends to surround the end of the vertical structure at a distance spaced apart from the end of the vertical structure.

7. The semiconductor memory device of claim 6, wherein a cross section of the insulating pattern is substantially a U shape.

8. The semiconductor memory device of claim 1, wherein the gate stack includes a memory cell array region, a contact region, and an edge region, the contact region and the edge region extending in different directions from the memory cell array region, and
   the gate stack is formed in a stepped structure within the contact region.

9. The semiconductor memory device of claim 8, wherein the source structure within the extension region, the discharge contact, and the insulating pattern are adjacent to at least one of the gate stack within the contact region and the gate stack within the edge region.

10. The semiconductor memory device of claim 8, further comprising:
    a channel layer passing through the gate stack within the memory cell array region and in contact with the source structure; and
    a memory pattern between the channel layer and the gate stack.

11. The semiconductor memory device of claim 1, wherein the vertical structure comprises:
    a conductive source contact connected to the source structure; and
    a spacer insulating layer between the conductive source contact and the gate stack.

12. A semiconductor memory device comprising:
    a semiconductor substrate;
    a source structure on the semiconductor substrate;
    a vertical structure disposed on the source structure;
    a plurality of conductive patterns disposed on both sides of the vertical structure, spaced apart from each other, and stacked on the source structure;
    a discharge contact passing through a partial region of the source structure at a distance spaced apart from the vertical structure, wherein the discharge contact directly contacts a portion of the source structure without intervening an insulating material between the sidewall of the discharge contact and the portion of the source structure;
    an insulating pattern passing through the source structure between the discharge contact and the vertical structure;
    a channel layer passing through the plurality of conductive patterns and connected to the source structure; and
    a memory pattern between each of the plurality of conductive patterns and the channel layer.

13. The semiconductor memory device of claim 12, wherein the semiconductor substrate includes a discharge impurity region, and
    the source structure is connected to the discharge impurity region via the discharge contact.

14. The semiconductor memory device of claim 12, wherein the source structure comprises:
    a lower source layer on the semiconductor substrate;
    a doped semiconductor layer disposed on the lower source layer; and
    an undoped semiconductor layer disposed on the lower source layer at a level at which the doped semiconductor layer is disposed.

15. The semiconductor memory device of claim 14, wherein the lower source layer is in contact with a bottom surface of the doped semiconductor layer,
    the doped semiconductor layer is in contact with a sidewall of the channel layer and extends to overlap by a plurality of conductive patterns;
    the undoped semiconductor layer is in contact with the sidewall of the discharge contact and surrounds the sidewall of the discharge contact, and
    the insulating pattern is disposed between the doped semiconductor layer and the undoped semiconductor layer, and passes through the lower source layer.

16. The semiconductor memory device of claim 12, wherein the insulating pattern extends to surround an end of the vertical structure at a distance spaced apart from the end of the vertical structure.

17. The semiconductor memory device of claim 16, wherein a cross section of the insulating pattern is substantially a U shape.

* * * * *